United States Patent
Cakebread

(10) Patent No.: US 12,099,080 B2
(45) Date of Patent: Sep. 24, 2024

(54) INGRESS PROTECTION ASSEMBLY FOR A UTILITY METER AND METER ARRANGEMENT COMPRISING SAME

(71) Applicant: Landis+Gyr AG, Cham (CH)

(72) Inventor: Andrew Cakebread, Peterborough (GB)

(73) Assignee: Landis+Gyr AG, Cham (CH)

( * ) Notice: Subject to any disclaimer, the term of this patent is extended or adjusted under 35 U.S.C. 154(b) by 407 days.

(21) Appl. No.: 17/606,888

(22) PCT Filed: Mar. 26, 2020

(86) PCT No.: PCT/EP2020/058602
§ 371 (c)(1),
(2) Date: Oct. 27, 2021

(87) PCT Pub. No.: WO2020/229041
PCT Pub. Date: Nov. 19, 2020

(65) Prior Publication Data
US 2022/0206048 A1 Jun. 30, 2022

(30) Foreign Application Priority Data
May 14, 2019 (EP) ..................... 19174429

(51) Int. Cl.
*G01R 22/06* (2006.01)
*H02G 3/08* (2006.01)
*H02G 3/22* (2006.01)

(52) U.S. Cl.
CPC ........... *G01R 22/065* (2013.01); *H02G 3/088* (2013.01); *H02G 3/22* (2013.01)

(58) Field of Classification Search
CPC .... G01R 22/065; G01R 22/061; H02G 3/088; H02G 3/22; Y04S 20/242; G01D 4/002
See application file for complete search history.

(56) References Cited

U.S. PATENT DOCUMENTS 4,153,931 A * 5/1979 Green .................. G06Q 10/087
382/229
4,223,178 A * 9/1980 Lass .......................... F16L 3/10
174/650

(Continued)

FOREIGN PATENT DOCUMENTS

| CN | 207503344 U | 6/2018 |
|---|---|---|
| DE | 8705343 U1 | 7/1987 |

(Continued)

OTHER PUBLICATIONS

International Search Report and Written Opinion, PCT Patent Application No. PCT/EP2020/058602, Jul. 9, 2020, 15 pages.

(Continued)

*Primary Examiner* — Timothy J Thompson
*Assistant Examiner* — Harmandeep Singh
(74) *Attorney, Agent, or Firm* — Kilpatrick Townsend & Stockton LLP

(57) ABSTRACT

An ingress protection assembly for leading a wire, such as a signal and/or a supply line, through a partition wall of an electrical device is provided. The ingress protection assembly includes a first wall section provided with a receiving slot extending through the first wall section in a lead-through direction and opening at an inlet facing in an assembly direction of the ingress protection assembly; and a second wall section provided with a counter slot extending through the second wall section in the lead-through direction and opening at a counter inlet facing against the assembly direction, wherein at least in a fully assembled state of the ingress protection assembly, the first wall section and the second wall section are at least partially superimposed in a projection along the lead-through direction such that the receiving slot and the counter slot together form an aperture configured for tightly encompassing the wire.

16 Claims, 13 Drawing Sheets

(56) References Cited

U.S. PATENT DOCUMENTS

| | | | |
|---|---|---|---|
| 4,851,611 A | 7/1989 | De et al. | |
| 5,122,741 A | 6/1992 | Ohsumi | |
| 5,581,179 A | 12/1996 | Engel et al. | |
| 6,165,012 A | 12/2000 | Abe et al. | |
| 9,660,388 B2 * | 5/2017 | Dunwoody | H01R 13/6592 |
| 9,758,114 B1 | 9/2017 | Volpone et al. | |
| 2002/0031939 A1 * | 3/2002 | Sawada | H01R 13/5837 |
| | | | 439/456 |
| 2005/0204534 A1 | 9/2005 | Bellis et al. | |
| 2007/0299562 A1 | 12/2007 | Kates | |
| 2008/0238711 A1 | 10/2008 | Payne et al. | |
| 2010/0070091 A1 | 3/2010 | Watson et al. | |
| 2013/0178994 A1 | 7/2013 | Valluri et al. | |
| 2014/0216811 A1 * | 8/2014 | Turner | H02G 15/007 |
| | | | 174/659 |
| 2015/0036267 A1 | 2/2015 | Miller et al. | |
| 2015/0229041 A1 * | 8/2015 | Lin | H01R 4/2433 |
| | | | 439/404 |
| 2016/0252367 A1 | 9/2016 | Banhegyesi et al. | |

FOREIGN PATENT DOCUMENTS

| | | |
|---|---|---|
| DE | 19620548 A1 | 12/1996 |
| DE | 19527702 A1 | 1/1997 |
| DE | 29605862 U1 | 4/1997 |
| DE | 102008010319 A1 | 8/2008 |
| DE | 102008061185 A1 | 3/2010 |
| DE | 102008063878 A1 | 7/2010 |
| DE | 102014225856 A1 | 6/2016 |
| DE | 102016211755 B3 | 12/2017 |
| EP | 0875727 A1 | 11/1998 |
| EP | 2686601 B1 | 1/2014 |
| EP | 3383057 A1 | 10/2018 |
| KR | 100831347 B1 | 5/2008 |
| WO | 2013151231 A1 | 10/2013 |
| WO | 2015/024068 A1 | 2/2015 |
| WO | 2018/068763 A1 | 4/2018 |
| WO | 2018/195588 A1 | 11/2018 |

OTHER PUBLICATIONS

Office Action, European Patent Application No. 20714598.8, Apr. 28, 2023, 5 pages.

* cited by examiner

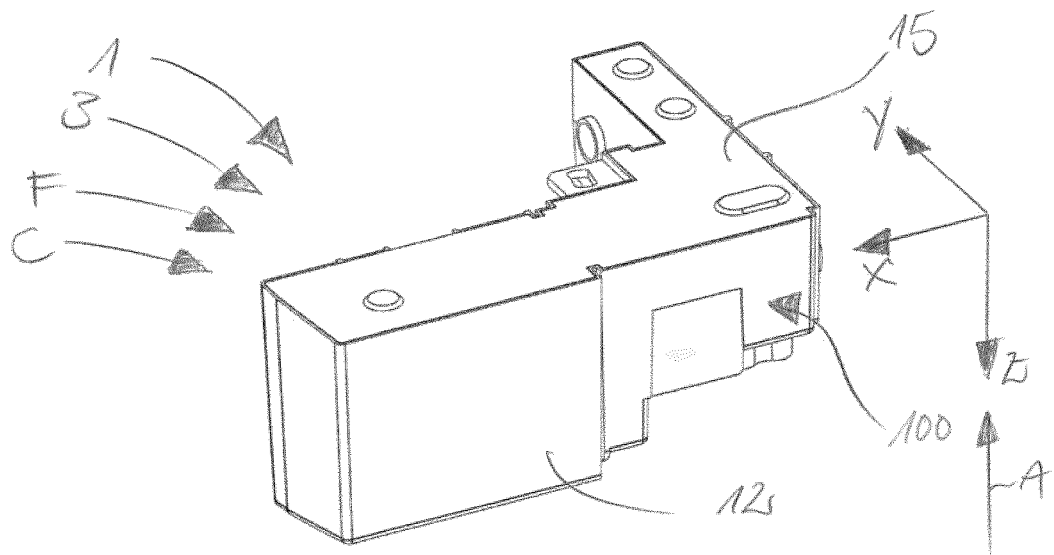
Fig. 21
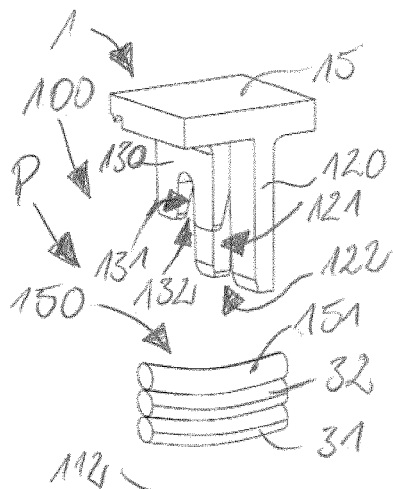
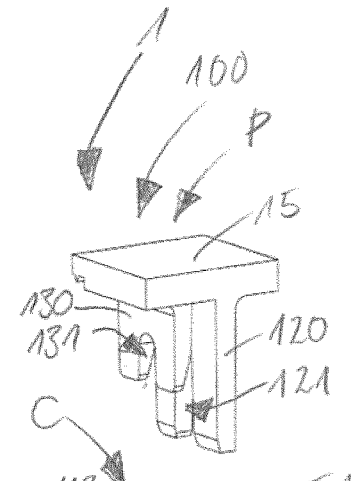
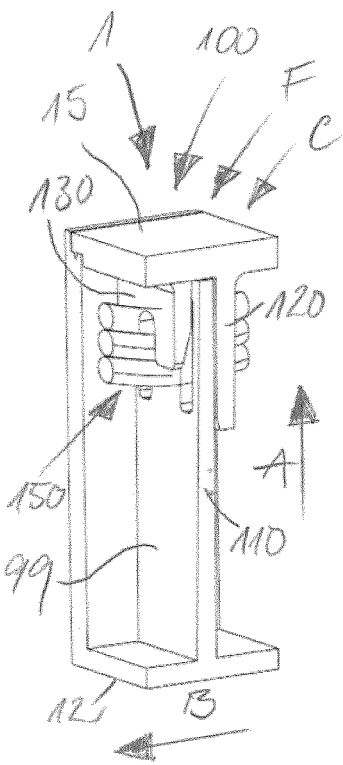
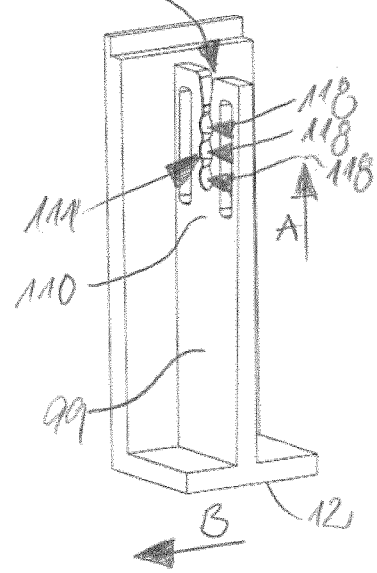
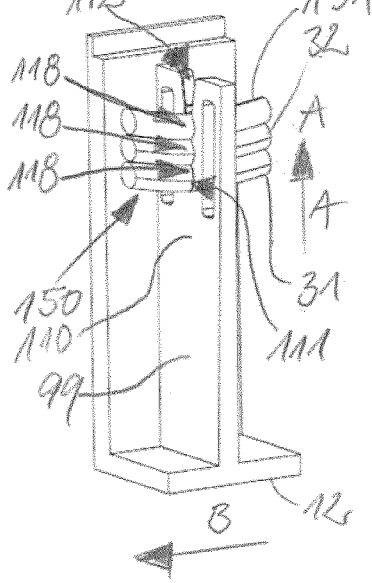
Fig. 22     Fig. 23     Fig. 24

INGRESS PROTECTION ASSEMBLY FOR A UTILITY METER AND METER ARRANGEMENT COMPRISING SAME

The present invention relates to an ingress protection assembly for an electrical device, e.g. a utility meter, and to an electrical device, such as a meter arrangement, comprising an ingress protection assembly.

TECHNOLOGICAL BACKGROUND

Electrical devices, such as utility meters, for example electricity meters, are known from the prior art and serve for determining an amount of consumption of a medium, like water or gas, or of electrical energy supplied. In order to connect the utility meter to a power supply or to a source of electrical energy to be supplied and metered, utility meters comprise conductor connection devices including terminals configured to take up bared ends of electrical lines delivering the electrical energy. For measuring the consumption as well as for communicating over wired and wireless connections, the utility meters comprise electrical circuits, for example provided on and as printed circuit boards. Furthermore, the utility meters comprise control elements, like displays, push buttons, switches and alike, so that they may be controlled, adjusted and operated by respective operators, like e.g. personnel installing and maintaining the utility meters.

The terminals, electrical circuits and control elements on the one hand need to be protected against harmful environmental impacts, like dust, moisture, and alike, as well as against tampering. On the other hand, customers of the electrical energy as well as operators need to be protected against electrical shock from the electrical lines. Therefore, the terminals, electrical circuits and control elements are housed in by means of enclosures. These enclosures are commonly comprised of several parts. For example, a terminal cover part is formed and arranged to cover the terminals such that they can be accessed only by an admitted professional operator. An exterior cover part is formed and arranged so that it protects electrical circuits and may provide access to the control elements at a front side of the utility meter. A base part is provided to at least partly enclose the terminals, electrical circuits and control elements at a back side the utility meter, and commonly also serves for mounting the utility meter to in an electric cabinet or to a wall of a building or construction where the utility meter is installed.

Load control devices are commonly used for the control of additional loads, in particular high current domestic appliances, such as storage heaters or water heating. These appliances are controlled by switching them on or off according to respective specifications. For example, the appliances are switched off during times, where peak tariffs apply to electricity metered.

According to the prior art, load control devices are either built into the utility meter, such that the load control devices are received in the enclosure of the utility meter itself. Such a bespoke utility meter having a built-in load control device would then require five terminals, namely for a live input, neutral input, neutral output, first live output, which would be uncontrolled, and second live output, which would be controlled by means of the load control device. Alternatively, the fifth terminal for the second live output would be realised by fitting a standard four terminal meter plus a separate remote load control device. Such a separate remote load control device would then be mounted remote from the utility meter, controlled by means of respective control wires, and would require that the second live output to be controlled is branched off from the first live output in a respective additional cable distribution box.

DE 195 27 702 A1 describes a unit assembly comprising a computer for processing data from a flow or heat rate measurement value transmitter and having a housing to which a measurement value transmitter can be coupled by a means of a measurement data transmission system. The housing of the unit assembly of the computer is arranged spatially separate from the housing of the measurement value transmitter. It is fixed at a suitable holder by form locking and is coupled by the measurement data remote transmission system. The housing of the unit assembly has an upper part, to which an auxiliary module for data transfer is fixed.

US 2010/0070091 A1 describes an appliance for conditioning air of a room, comprising one or more power consuming features/functions including a temperature controlling element for one of heating and cooling air. A controller is operatively connected to the one or more power consuming features/functions. The controller is configured to receive and process a signal indicative of a utility state. The controller operates the appliance in one of a plurality of operating modes, including at least a normal operating mode and an energy savings mode in response to the received signal. The controller is configured to at least one of selectively adjust and deactivate at least one of the one or more power consuming features/functions to reduce power consumption of the appliance in the energy savings mode.

EP 2 686 601 B1 discloses an arrangement of a gas delivery control system and one or more appliances including a central heating installation. The one or more appliances are arranged for generating a request signal indicative for a requested supply of gas by at least one of the appliances. The gas delivery control system comprises, a controllable gas valve having an input to be coupled to a gas supply via a conduit and having an output, a control device for controlling the controllable valve, wherein the control device controls the controllable valve in accordance with a value of the request signal of the one or more appliances coupled to the output of the valve via a conduit, a gas pressure sensor for determining whether the gas pressure in the conduit has a value lower than a pressure reference value, a reference module for determining whether a predetermined time interval has lapsed since a closure of the controllable gas valve, and an error signalling module for issuing an error signal if it is detected before a lapse of the predetermined time interval that the gas pressure is lower than the pressure reference value.

EP 3 383 057 A1, filed on behalf of the applicant of the present disclosure, relates to a metering device, in particular an electricity meter for metering electrical energy, comprising a communication unit enabling node mesh communication between the metering device and at least one further metering device, and to an AMI System for metering utility consumption, in particular of electrical energy. By adding a communication module to a metering device, the metering device is transformed from being merely a communication mesh node configured for communication with at least one further metering device acting as a mesh node, into a gateway configured to establish an uplink and/or downlink connection within the AMI system.

US 2016/0252367 A1 deals with an intelligent electronic device including a metering sub-assembly and an input base module sub-assembly. The metering sub-assembly is hinged to the input base module sub-assembly, where when in an open position, various cables, connectors, and input/output cards/modules are accessible. Various input/output cards/modules are interchangeable to add/change functionality and/or communication capabilities to the intelligent electronic device.

Solutions for providing load control devices or other auxiliary equipment or modules to utility meters as known from the prior art have several disadvantages and drawbacks.

If, on the one hand, the load control devices or other auxiliary equipment or modules are integrated into the utility meter, such a bespoke utility meter has to be designed accordingly and held on stock by installers and other personnel according to the respective demands that may occur. Furthermore, respective utility meters known from the prior art have to be kept compliant with technical requirements and regulations, despite the integration of load control devices or other auxiliary equipment or modules into the meters. These disadvantages lead to that providing bespoke utility meters integrating load control devices is cumbersome and costly, in particular in view of for each type of load control device or other auxiliary equipment or modules to be integrated into the utility meter, a new type of bespoke utility meter has to be developed.

On the other hand, if load control devices or other auxiliary equipment or modules as known from the prior art, are installed remotely from the utility meter, this leads to increase installation time for wiring and mounting the respective extra device. Such an extra device requires additional space on a support for mounting the meter, e.g. a meter board. However, such additional space is not always available. Furthermore, additional equipment for connecting the extra device and associated lines and cables has to be provided to an installer. The additional equipment and associated lines and cables may be a source of technical failures or could be prone to be tampered with.

Additional disadvantages of electrical devices as known from the prior art may arise where wires, such as signal lines and supply lines, have to be led through walls of electrical devices. Respective lead-through openings may create ingress paths for any kind of detrimental environmental impacts, such as dust, liquids or insects, which may enter certain areas of the electrical device where they may damage electrical and electronic parts, such as printed circuit boards (PCB), through causing short circuits, impairing electrical contacts, or alike. A wire lead-through may be particularly problematic if the wires have connectors pre-fitted to both ends of the wire, whereby passing the wire through a simple round hole is not possible. For avoiding a detrimental ingress, the use of additional parts such as gaskets or alike for sealing up between the wire in a through-hole are provided according to the prior art. However, application of such additional parts is often costly and cumbersome.

DESCRIPTION OF THE INVENTION

It is an object of the present invention to at least partly mitigate some of the above-mentioned disadvantages of electrical devices as known from the prior art. In particular, an object underlying the invention is to provide a wire lead-through protected against ingress in a cost-effective and efficient manner without compromising the ingress protection with regard to safety, security and/or technical requirements.

For an ingress protection assembly for leading a wire, such as a signal line and/or supply line, in a sealed-up manner through a partition wall of an electrical device, these objects are at least partially achieved in that the ingress protection assembly comprises a first wall section provided with a receiving slot extending through the first wall section in a lead-through direction and opening at an inlet facing in an assembly direction of the ingress protection assembly; and a second wall section provided with a counter slot extending through the second wall section in the lead-through direction and opening at a counter inlet facing against the assembly direction, wherein at least in a fully assembled state of the ingress protection assembly, the first wall section and the second wall section are at least partially superimposed in a projection along the lead-through direction such that the receiving slot and the counter slot together form an aperture configured for tightly encompassing the wire.

For an electrical device, in particular a meter arrangement, these objects are at least partially achieved in that the electrical device comprises an ingress protection assembly according to the present invention.

An ingress protection assembly according to the present invention provides that the wire may be inserted via the inlet into the receiving slot of the first wall portion where the wire can then be clamped in a liquid tight manner by the counter slot exerting a pressure onto the wire in a direction opposite to the assembly direction. The wire is thus led-through the aperture formed by the receiving slot and the counter slot in an essentially liquid-tight manner without the need of providing any additional sealing means, such as a gasket or alike. An elastic and/or plastic deformability of the wire, in particular a sheathing thereof, and/or of the material constituting the wall sections or at least edge surfaces of the slots abutting the wire, which may be manufactured of a plastic material for example, can be utilised for sealing-up between the wire and the wall sections.

Unless explicitly stated to the contrary, the solutions according to the invention can be combined as desired and further improved by the further following embodiments that are advantages on their own, in each case. A skilled artisan will readily recognise that any apparatus features of an ingress protection assembly for an electrical device, e.g. a utility meter, and to an electrical device, such as a meter arrangement, comprising an ingress protection assembly according to the present invention can be easily implemented as method steps as well as features of embodiments of a method according to the present invention, and vice versa.

According to a possible embodiment, at least in the fully assembled state, the first wall section and the second wall section abut each other in the lead-through direction. Preferably, the wall sections are aligned with each other in the summer direction such that they lie flush against each other. Thereby, any gaps or slits between the first and the second wall section, through which insects, dust, liquids or other detrimental substances could pass through can be avoided or at least minimised.

According to a possible embodiment, at least one of the receiving slot, and the counter slot is terminated by a yoke section providing a seating surface facing towards the inlet or the counter inlet, respectively. At least one of the first and the second wall section may be formed in the shape of legs extending essentially in parallel along the slot and being joined to each other at the yoke section. The slots may be formed as U-shaped incisions in the wall sections with the inlets of the U-shape facing each other as the first and the second wall section are moved towards each other in an against the assembly direction, whereby a length of the aperture measured in parallel with the assembly direction is variably adjustable for clamping the wire between the two opposing sealing surfaces.

According to a possible embodiment, at least one of the receiving slot, and the counter slot at least section-wise tapers along the lead-through direction. A clear width measured in parallel to a longitudinal direction extending essentially perpendicularly to the assembly direction as well as the lead-through direction between lateral edges of the slot may be narrowing along the aperture in the lead-through direction. Thereby, clamping edges may be formed extending along an inner circumference of the first slot and/or the second slot for concentrating a pressure exerted on the outer circumference of the wire within the slots for further enhancing elastic and/or plastic deformability of the wire and/or the wall sections in the region of the aperture.

According to a possible embodiment, at least one of the inlet, and the counter inlet is provided with a lead-in chamfer. Lead-in chamfers may be provided on both sides of the slot for forming an intake opening. Thereby, the inlet may have a funnel-like shape for facilitating an introduction of the wire into the respective slot in an area of a lateral rim or edge of the wall section facing in against the assembly direction, respectively. Through the funnel-like shape of the inlet, an outer width of the wire may exceed and in a width of the slot, so that when the wire is introduced into the slot, it is gradually increasingly compressed along its circumference for a mandatory elastic and/or plastic deformation of the wire and/or the wall section in the region of the aperture.

According to a possible embodiment, at least one of the receiving slot and the counter receiving slot partially widen in a longitudinal direction of the ingress protection assembly extending essentially perpendicularly to the assembly direction and the lead-through direction, to form a wire compartment configured for tightly encompassing an outer circumference of the wire. In other words, an additional funnel-like shape may be provided to the slot in the region of the aperture where the slot then tapers in or against the lead-through direction. In the region of the wire compartment, the slot may provide frustoconical contour for further improving a liquid-tight grip on the wire in the aperture.

According to a possible embodiment, at least two wire compartments are arranged next each other along the assembly direction. A number of wire compartments arranged next to each other in the assembly direction along the slot preferably corresponds to a number of lines of a wire to be led-through the aperture. In other words, the aperture may essentially be formed by a number of wire compartments. The wire compartments may at least partly overlap or merge into each other such that multiple lines of a wire are compressed by each other as well as between edge surfaces of the slots.

According to a possible embodiment, next to at least one of the receiving slot and the counter slot, a cut-out is formed in the first wall section or the second wall section, respectively. The cut-out may extend in the vicinity of the slot essentially in parallel to the slot. Thereby, the cut-out enhances an elasticity of lateral edge regions of the slots for facilitating an introduction of the wire into the slot as well as enhancing and elastic displacement of edge surfaces of the slot abutting the wire for improving a snug fit of the wire within the slot and thus enhancing the sealing effect. For example, a cut-out may be provided at each side of the slot for providing a symmetric displaceability of the edge regions of the slot abutting the wire.

According to a possible embodiment, at least in the fully assembled state, the at least one cut-out is covered by the respective opposing first wall section or second wall section. Thereby, the respective opposing wall section can close up the slot. Any ingress of insects, dust or water through the cut-outs may thus be prevented.

According to a possible embodiment, a third wall section of the ingress protection assembly is provided with an additional counter slot extending through the third wall section in the lead-through direction and having an additional counter inlet facing against the assembly direction, wherein at least in the fully assembled state, the first wall section is arranged between the second wall section and the third wall section such that they are at least partially superimposed in a projection along the lead-through direction and the receiving slot, the counter receiving slot, and the counter receiving slot together form the aperture. The counter slot and the additional counter slot can be aligned with each other in the lead-through direction. The first wall section is thus sandwiched between the second and third wall sections for improving the sealing-effect of an ingress protection assembly according to the present invention.

According to a possible embodiment, a height of the third wall section is smaller than the height of the second wall section measured in parallel to the assembly direction. Thereby, a tilting of the first wall section upon introduction into an intermediate space formed between the second wall section of the third wall section may be prevented. Bringing the first wall section into engagement with the second wall section and the third wall section by moving them towards each other in or against the assembly direction, respectively, for transferring the ingress protection assembly into the fully assembled state, is facilitated.

According to a possible embodiment, a bevel is formed at a vertical edge of at least one of the first wall section and the second wall section and at least partially facing towards the first wall section. A vertical length of the bevel on the third wall section may be larger than the vertical length of the bevel on the second wall section measured essentially in parallel to the sender direction. Thereby, an introduction of the first wall section between the second wall section and the third wall section is further facilitated. This is particularly of advantage if the first wall section is dimensioned with respect to the intermediate space formed between the second wall section and the third wall section such that a press-fit or transition fit is provided between the first wall section and at least one of the second wall section of the third wall section in the lead-through direction.

According to a possible embodiment, at least one of the second wall section and the third wall section has a root area provided with a curvature at least partially facing away from the first wall section. The curvature may help improving spring forces urging the second wall section and/or the third wall section towards the first wall section. Thereby, a pressure exerted by the second wall section and/or the third wall section onto the first wall section in and/or against the lead-through direction, respectively, may be improved, thus enhancing the sealing effect provided by an ingress protection assembly according to the present invention.

According to a possible embodiment, the first wall section is part of the partition wall. The partition wall may separate compartments within the electrical device from each other, such as an inner space of the electrical device accommodating electronic components, e.g. PCBs or alike, from other parts of the electrical device. Alternatively, or additionally, the partition wall may be an outside wall of an enclosure of the electrical device. Thus, an ingress protection assembly according to the present invention may be provided in a cost-effective manner and that is at least partly formed at the partition wall without the need of providing additional parts or elements, such as gaskets or alike.

It is a further object of the present invention, to at least partly mitigate some of the above-mentioned disadvantages of load control devices for utility meters as known from the prior art. In particular, a further object underlying the invention is to provide load control devices in a cost-effective and efficient manner without compromising compliance of the utility meter with regard to safety, security and/or technical requirements.

For a load control module for a utility meter, in particular for controlling a high current domestic appliance, these further objects are at least partly achieved in that the load control module is configured such that in an installed state, at least a section of the load control module is arranged adjacent to a side face of the utility meter.

For a meter arrangement, these further objects are at least partly achieved in that it comprises a utility meter provided with a load control module according to the present invention.

Thereby, the load control module extends alongside the side face of the utility meter and may abut the utility meter. In other words, the load control module and utility meter may be arranged side-by-side in the installed state. This has the decisive advantage over the prior art that the meter arrangement comprising the meter in the load control module is very compact. Thus, installation time and space are reduced in comparison to the prior art. By providing the utility meter with the load control module, any existing type of electricity meter can be easily equipped with a functionality as provided by the load control module. Development costs for bespoke utility meters having a respective load control functionality can be saved. Utility benefits from only sourcing one or very few versions of utility meters, which helps in their asset management before and after install. Installation personnel benefits but only needing to carry and learn the installation and operation requirements for one type of utility meter. For consumers and future servicing requirements, provision of a load control module according to the present invention provides a tidy and smart solution.

According to a possible embodiment, the load control module is configured such that in the installed state, at least a section of the load control module is adjacent to a lower side of the utility meter. The load control module may extend alongside a bottom side of the utility meter and may abut the utility meter also there. Thereby, the compactness of the meter arrangement can be further improved.

According to a possible embodiment, the module base of the load control module is configured to engage with a meter base of the utility meter. The engagement may involve a protrusion, lug or extension on the module base that juts into a recess formed at the meter base. Complementary contours of the meter base and the module base may be provided such that a contact surface between the load control module and the utility meter has a meandering shape. This further helps in improving the compactness of the meter arrangement.

According to a possible embodiment, the load control module is configured to share a common fixing location with the utility meter for jointly fixing the load control module and the utility meter to a supporting structure. No additional fixing elements for mounting the load control module to a supporting structure are required when fitting the load control module to a pre-installed utility meter. This helps to closely couple the load control module to the utility meter and save installation efforts.

According to a possible embodiment, a module main cover of the load control module is configured to engage with a meter main cover of the utility meter. No additional fixing elements for attaching the module main cover to the meter main cover are required. This helps to further improve the mechanical coupling between load control module on the utility meter as well as to save installation efforts.

According to a possible embodiment, the load control module is provided with a latching element configured to be latched at the utility meter in the installed state. In particular the module main cover can be provided with the latching element, so that in conjunction with protrusion and/or common fixing location in the region of the module base, a mechanically very stable and reliable coupling between the load control module and the utility meter is provided. The latching element may be formed as a latching lug having a latching nose on its end which snaps behind the counter latching element, such as a recess or a shoulder, formed at the utility meter, in the installed state. This facilitates attaching the load control module to the side face of the utility meter, and thereby helps to closely couple the load control monitor the utility meter and save installation efforts.

According to a possible embodiment, a module inner terminal cover of the load control module is configured to at least in part complement a meter inner terminal cover of the utility meter in the installed state. Thereby, in particular at a bottom side of the utility meter, the meter terminal cover may be extended by the module terminal cover. This helps in reducing the overall height of the meter arrangement, and thus helps in further reducing the installation space required by the meter arrangement.

According to a possible embodiment, a module terminal of the load control module is configured to be arranged in alignment with a meter terminal of the utility meter in the installed state, such that a power cable can be received in both, the module terminal and the meter terminal. The module terminals maybe formed as feed through terminals. Through-holes of the feed through terminals then align with openings for introducing the power cable into the meter terminals. Thereby, the meter terminals in conjunction with the module terminals constitute a combined terminal block. At least one of the module terminals may be held in a conductor, such as a copper bar, forming part of a primary current path. A cable installation of the power cable only needs to be stripped back further than usual in order to then be introduced into the combined terminal block by sticking the bared end of the power cable through the module terminal and then inserting the end into the meter terminal. This helps in further reducing the size, in particular the height, of the meter arrangement, and in facilitating installation of the meter arrangement.

According to a possible embodiment, a control line, a signal line, and/or a supply line of the load control module are/is extending through a wall portion of the load control module. The wall portion may be part of a module enclosure. The control line can be connected to auxiliary control terminals of the utility meter. The supply lines can be connected to mains terminals of utility meter. The control lines and/or supply lines can be guided through the module enclosure to neatly align with the auxiliary terminals on the utility meter. All control lines and/or supply lines for operating the load control module can be routed by means of cable guides profoundly all control lines and social supply lines can be routed by means of the cable guides in the module enclosure and can be terminated by means of a respective connector at the substrate, such as a printed circuit board (PCB), of the load control module. This helps to further improve the compactness of the meter arrangement, and to facilitate installation thereof.

According to a possible embodiment, a module enclosure of the load control module is provided with at least one guide vane for keeping liquid away from the utility meter in the installed state. The guide vane can be provided in the form of a lamella or alike, preferably extending vertically along the module enclosure, such that any liquid that might escape from an appliance operated in conjunction with the load control module, such as water from a water heating system, or condensation from an air conditioning system, is kept away from the meter terminals. This helps to improve compliance of the meter arrangement, in particular regarding IP ratings concerning the resistance of the meter arrangement against water and dust.

According to a possible embodiment, the at least one guide vane at least partially defines a liquid channel for channelling liquid away from the utility meter in the installed state. The liquid channel may provide a controlled flow of any liquid which helps to assure that the liquid is kept away from the utility meter in the installed state. This helps to further improve compliance of the meter arrangement, in particular regarding IP ratings concerning the resistance of the meter arrangement against water and dust.

According to a possible embodiment, the module enclosure provides at least one liquid outlet. The liquid outlet may be formed as hole or slot at a lower side of the module enclosure. This helps to further improve the ability of the meter arrangement to channel away any liquid such that it may not affect the meter terminals.

According to a possible embodiment, an outer terminal cover of the load control module is configured to at least sectionwise cover both, a module terminal block of the load control module, and a meter terminal block of the utility meter. In other words, a combined terminal cover may be provided for covering the meter terminals and the module terminals. This helps to reduce a number of parts required for providing the meter arrangement. Compactness of the meter arrangement is further improved while at the same time efforts for installing the meter arrangement are reduced.

According to a possible embodiment, the outer terminal cover is provided with a parting member configured to protrude into a gap formed between the utility meter and the load control module in the installed state. The parting member can be formed as a blade. In a mounted state of the outer terminal cover, the parting member may form a labyrinth together with an enclosure portion of the electricity meter and/or of the load control module. Thus, the parting member together with the geometry of the utility meter and the load control module creates a labyrinth between the utility meter and control module. This helps to further improve the resistance of the meter arrangement against water and dust, as well as the ability of the meter arrangement to channel away any liquid such that it does not affect the meter terminals.

BRIEF DESCRIPTION OF THE DRAWINGS

The invention will be described hereinafter in more detail and in an exemplary manner using advantageous embodiments and with reference to the drawings. The described embodiments are only possible configurations in which, however, the individual features as described above can be provided independently of one another or can be omitted. In the drawings:

FIG. 21 shows a schematic perspective view of the electrical device, in particular the load control module, with the ingress protection assembly in the fully assembled state;

FIG. 22 shows a detail of the ingress protection assembly according to the present invention together with the wire in the pre-assembled state;

FIG. 23 shows a detail of the ingress protection assembly according to the present invention in the pre-assembled state together with the wire in the connected state;

FIG. 24 shows a detail of the ingress protection assembly according to the present invention in the fully assembled state together with the wire in the connected state;

WAYS OF EXECUTING THE INVENTION

Figure 1:
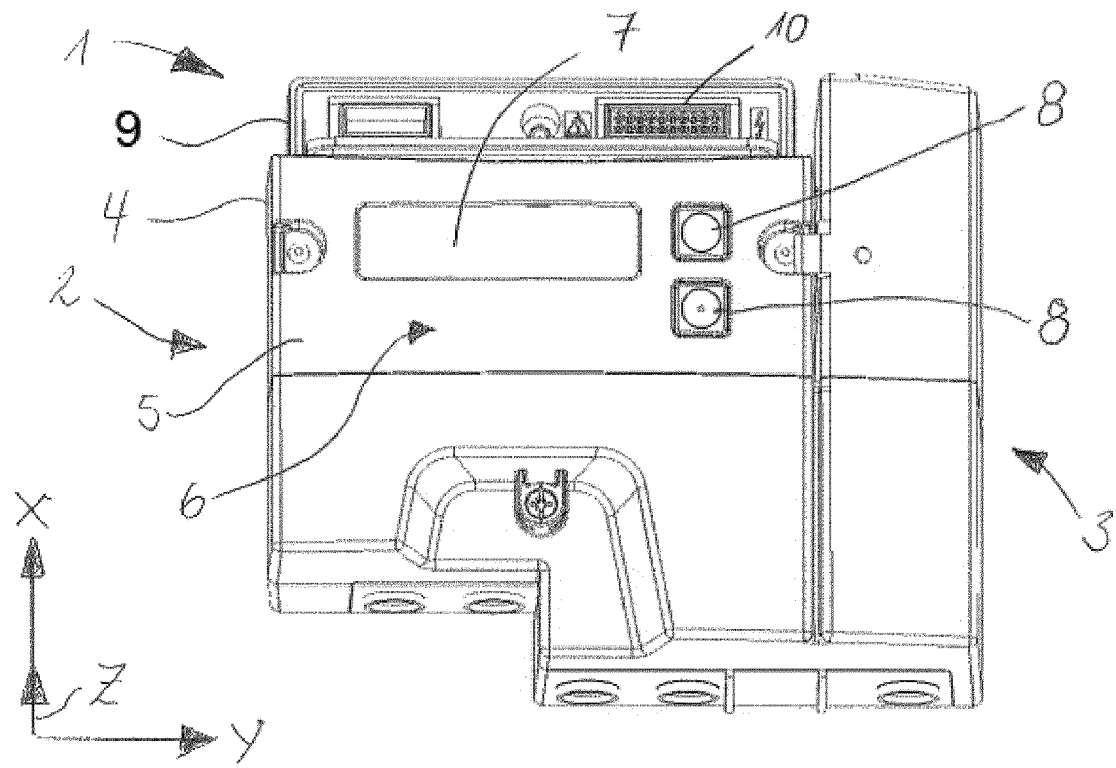
FIG. 1 shows schematic perspective front view of an embodiment of a meter arrangement comprising a utility meter and a load control module according to the present invention.

FIG. 1 shows a schematic front view of an exemplary embodiment of a meter arrangement 1 according to the present invention. The meter arrangement comprises a utility meter 2 and a load control module 3 which extend along a longitudinal direction X, a transverse direction Y, and a height direction Z, together constituting a Cartesian coordinate system. The utility meter 2 has a meter enclosure 4 providing an insulating housing for accommodating electronic components and conductor connection devices of the utility meter 1.

The meter enclosure 4 comprises a meter main cover 5 provided with a front panel 6 comprising a display 7 and controls 8 for monitoring and controlling, respectively, functionality and operation of the utility meter 2. Furthermore, the meter enclosure 4 is provided with a connector section 9 comprising at least one connector 10 in the form of a socket for connecting maintenance and/or control equipment to the utility meter 2 enabling installation personal to service and/or control functions of the utility meter 2 onsite.

Figure 2:
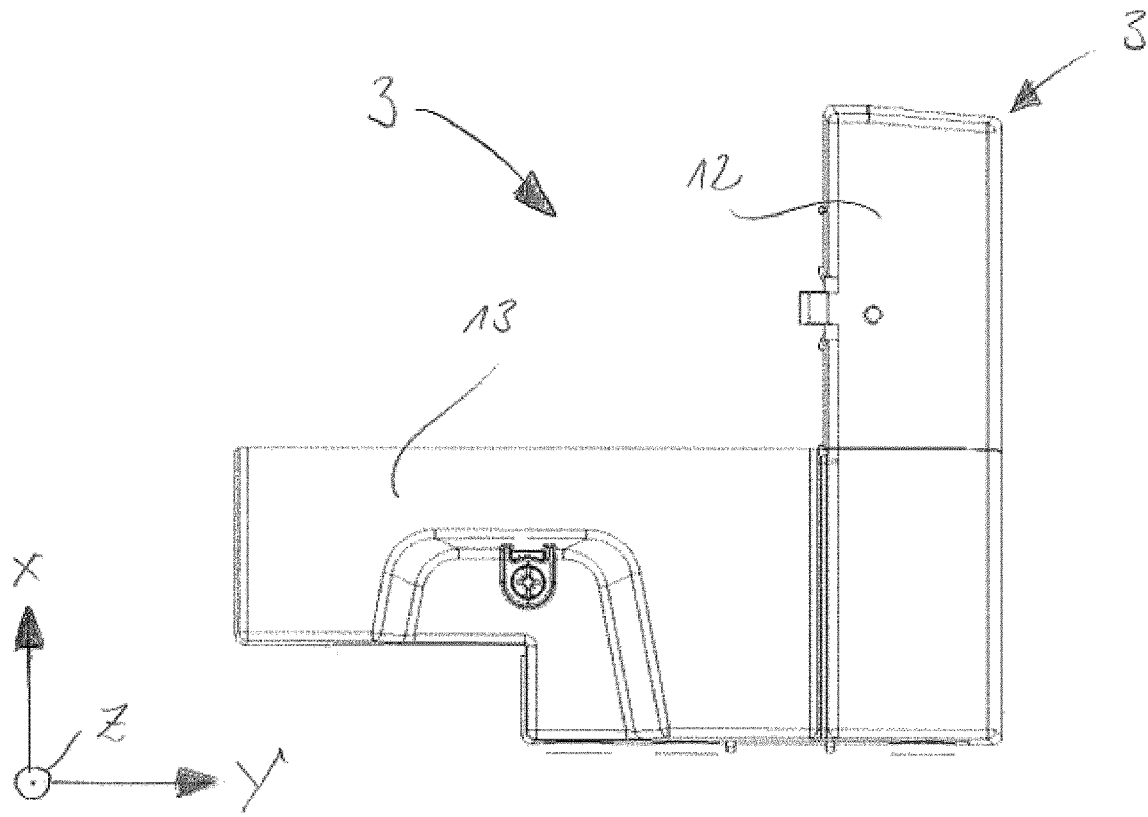
FIG. 2 shows schematic front view of the load control module shown in FIG. 1.

FIG. 2 shows schematic front view of the load control module 3 of the utility meter 2 shown in FIG. 1. The load control module 3 has a module enclosure 11 comprising a module main cover 12 and an outer terminal cover 13. The outer terminal cover 13 is formed such that it covers parts of the utility meter 2 and of the load control module 3. Thereby, the other terminal cover 13 the combined cover for the meter arrangement 1.

Figure 3:
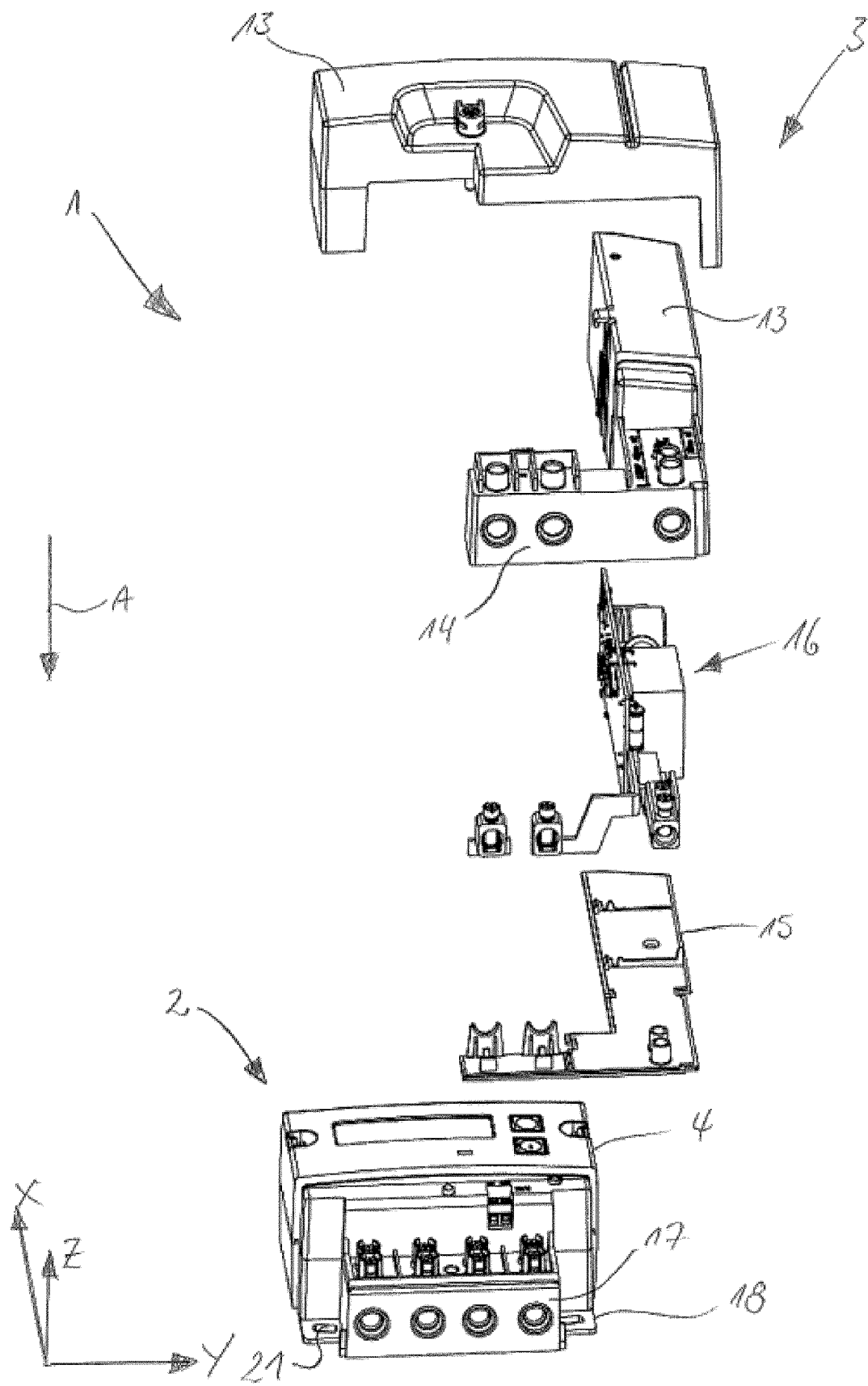
FIG. 3 shows schematic exploded view of the load control module shown in FIGS. 1 and 2 as it may be assembled and mounted to a utility meter.

FIG. 3 shows schematic exploded view of the load control module 3 shown in FIGS. 1 and 2 as it may be assembled and mounted to a utility meter 2. Here it becomes apparent, that besides the module main cover 12 and the outer terminal cover 13, the module enclosure 11 further comprises a module in a terminal cover 14, and a module base 15. The module main cover 13, module inner terminal, 14 and module base 15 are configured to surround a load control unit 16 of the load control module 3. The load control module 3 is configured such that it may be assembled by joining the load control unit 16 with the meter base 15, afterwards the module main cover 13 with the module base 15, and then the module inner terminal cover 14 with the module base 15 along a similar direction A.

The meter enclosure 4 further comprises an inner meter terminal cover 17 and a meter base 18. The meter main cover 5, meter terminal cover 17 and meter base 18 are configured to surround a metering unit (not shown) of the utility meter 2. After joining the load control module 3 with utility meter 2, the module inner terminal cover 14 and the meter in a terminal cover 17 can be jointly covered by the outer terminal cover 13 which is to be mated with the meter arrangement 1 in the assembly direction A. The outer terminal cover 13 is formed as a lid which is removable from the meter arrangement 1 to grant access to meter terminals 19 of the utility meter 2 and module terminals 20 of the load control module 3 (see FIG. 4). The meter base 4 is configured to be mounted to a supporting structure (not shown) and therefore provided with fixation means 21.

Figure 4:
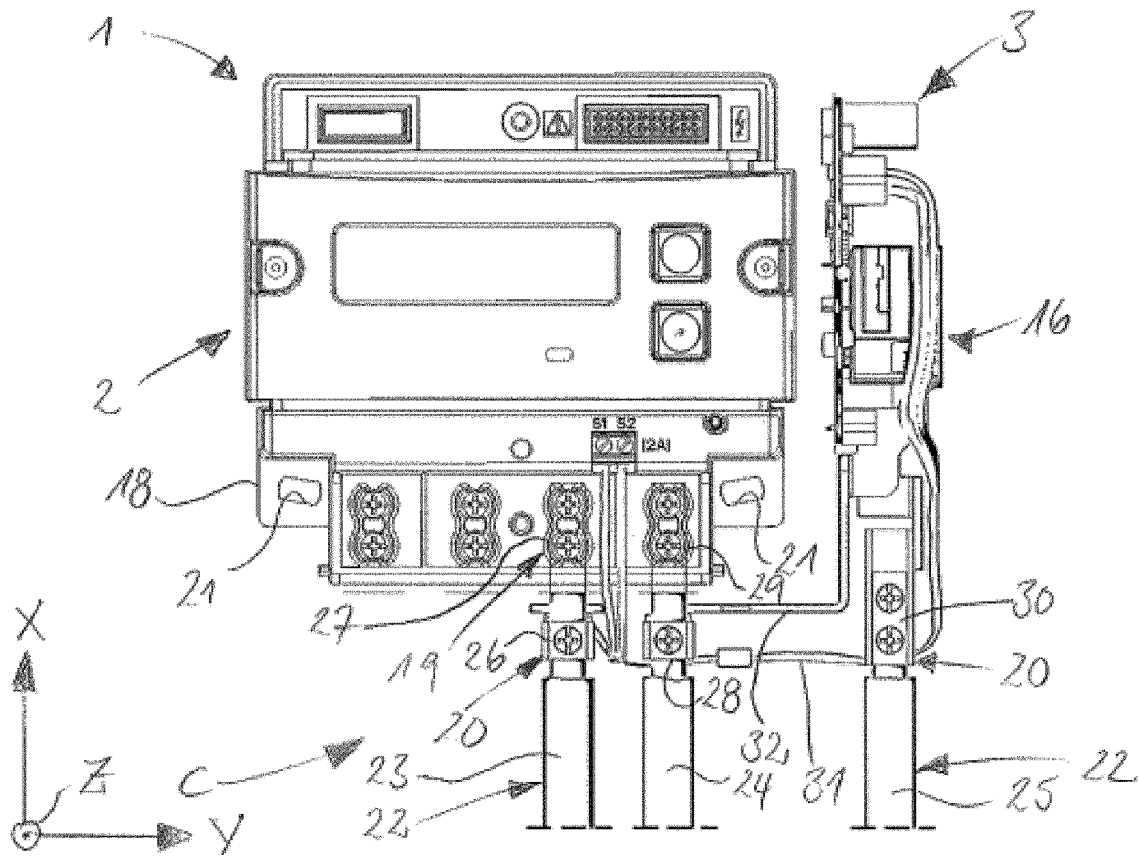
FIG. 4 shows a schematic front view of an embodiment of a load control module according to the present invention in a connected state.

FIG. 4 shows a schematic front view of an embodiment of the load control module 3 in a connected state C. In the connected state C, power cables 22 are connected to the meter terminals 19 and the model terminals 20. The power cables 22 comprise a neutral output line 23, a first live output line 24, and a second live output line 25. The neutral output line 23 is connected to module neutral output terminal 26 and to a meter neutral output terminal 27. The first live output line 24 is connected to a module live input terminal 28 and to a meter live output terminal 29. The second live output line 25 is connected to a module live output terminal 30. Furthermore, the load control module 3 is connected to the utility meter 2 via signal lines 31 and supply lines 32.

Figure 5:
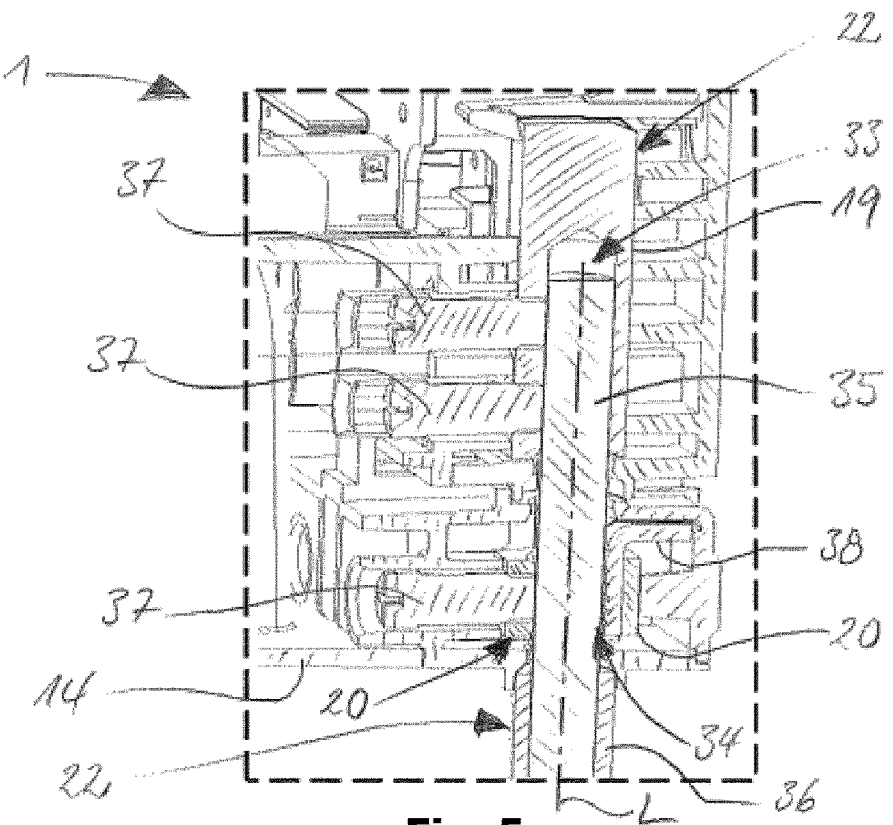
FIG. 5 shows a schematic perspective cross-sectional view of the load control module in the connected state along a cross-sectional plane extending along a longitudinal axis of a power cable received in a module terminal of the load control module and in a meter terminal of the utility meter.

FIG. 5 shows a schematic perspective cross-sectional view of the load control module 3 in the connected state C along a cross-sectional plane extending along a longitudinal axis L of a power cable 22 received in the module terminal 20 of the load control module 3 and in the meter terminal 19 of the utility meter 2. Here it becomes apparent that the meter terminal 19 comprises a blind hole 33, whereas the module terminal 20 comprises a through-hole 34. The power cable 22, in particular a bared end section 35 thereof, extends through the through-hole 34 into the blind hole 33, while an insulation 36 of the power cable 22 remains outside the module inner terminal cover 14. Fixation elements 37 in the form of locking screws fix the power cable 22 within the blind hole 33 and the through-hole 34. Furthermore, the module terminal 20 is provided with a conductor 38 for conducting electrical energy carried by the power cable 22 to the load control unit 16.

Figure 6:
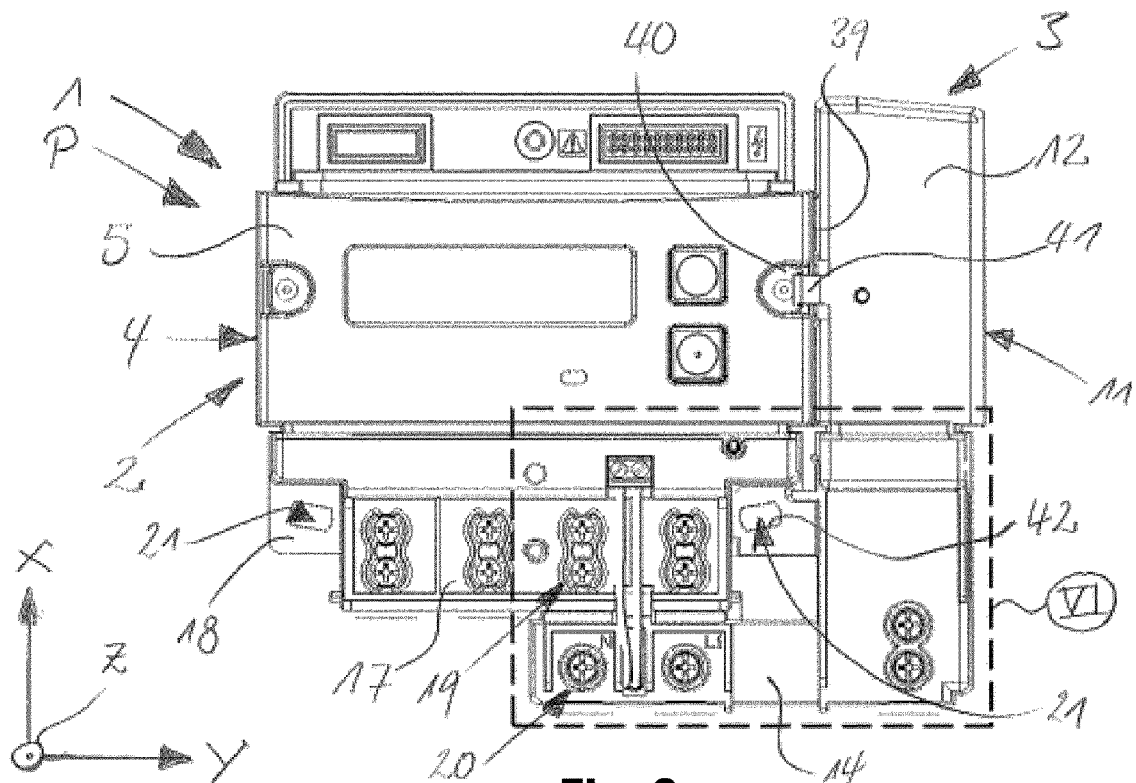
FIG. 6 shows a schematic front view of an embodiment of a meter arrangement according to the present invention in a pre-assembled state.

FIG. 6 shows a schematic front view of the meter arrangement 1 a pre-assembled state P. In the pre-assembled state P, the load control module 3 is attached to the utility meter 2. The load control module 3, in particular the module main cover 12, is adjacent to a side face 39 of the utility meter 2, in particular the meter main cover 5. A counter latching element 40 on the meter enclosure 4 is an engagement with the latching element 41 on the module enclosure 11. The latching element 41 is formed as a latching lug provided with the latching nose and extending away from the module enclosure 11, in particular the module main cover 12, in parallel to the transverse direction Y such that it overlaps with the meter enclosure 4 in a direction in parallel to the height direction Z and the latching nose of the latching element 41 may snap behind the counter latching element 40 formed as a recess on the front panel 6.

The module inner terminal cover 14 is adjacent both laterally, i.e. in the transverse direction Y, as well is particularly, i.e. in the longitudinal direction X to the meter inner terminal 17. Also, the module base 15 is adjacent to the meter base 18 in the longitudinal direction X as well as in the transverse direction Y. Consequently, the load control module 3 abuts the utility meter 2 from the side and from below. The fixing means 21, formed as eyelet on the meter base 18 is used as a common fixing location 42 for fixing both, the utility meter 2 and the load control module 3 to a supporting structure (not shown).

Figure 7:
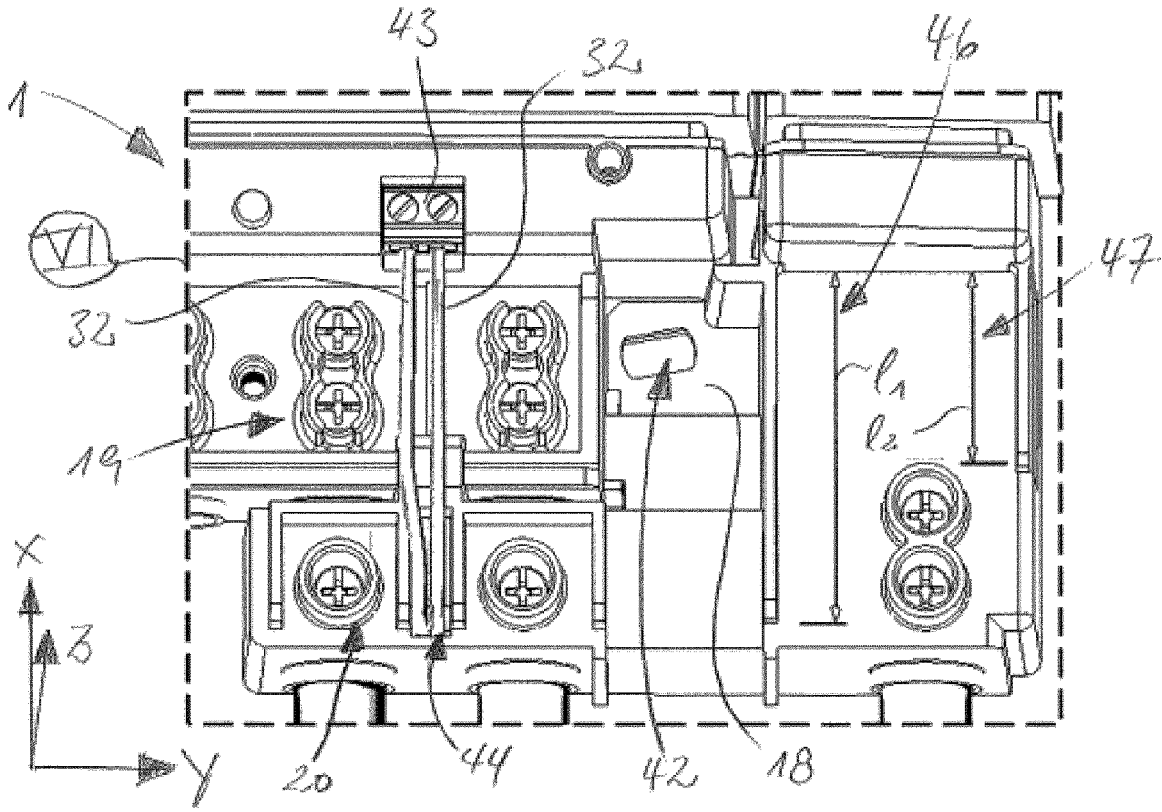
FIG. 7 shows a detail VI of the meter arrangement shown in FIG. 6.

FIG. 7 shows a detail VI of the meter arrangement shown in FIG. 6. Here it becomes apparent that the control lines 32 for controlling operation of the load control module 3 are connected to the utility meter 2 at an auxiliary control terminal 43 of the utility meter 2 arranged in the region of the meter inner terminal cover 17 above the meter terminals 19 and below the front panel 5 along the longitudinal direction X. The control lines 32 extend from the auxiliary control terminal 43 between the meter terminals 19 and the module terminals 20 downwardly and enter a control line passage 44 formed in the module inner terminal cover 14.

Furthermore, on the front face of the module inner terminal cover 14, a first gauge 46 and a second gauge 47 are arranged for indicating a first strip of length l1, and a second strip off length l2 of the power cables 22, both measured in parallel to the longitudinal axis L of the power cable 22. The first strip off length l1 is a length by which the insulation 36 of the power cable 22, in particular of the first live output line 24, has to be stripped off, i.e. removed, when the power cable 22 is to be inserted into both, the meter terminal 19 and the module terminal 20. The second strip off length l2 is a length by which the insulation 33 of the power cable has to be stripped off when the power cable 22 is to be inserted only into either one of the meter terminals 19 or one of the module terminals 20.

Figure 8:
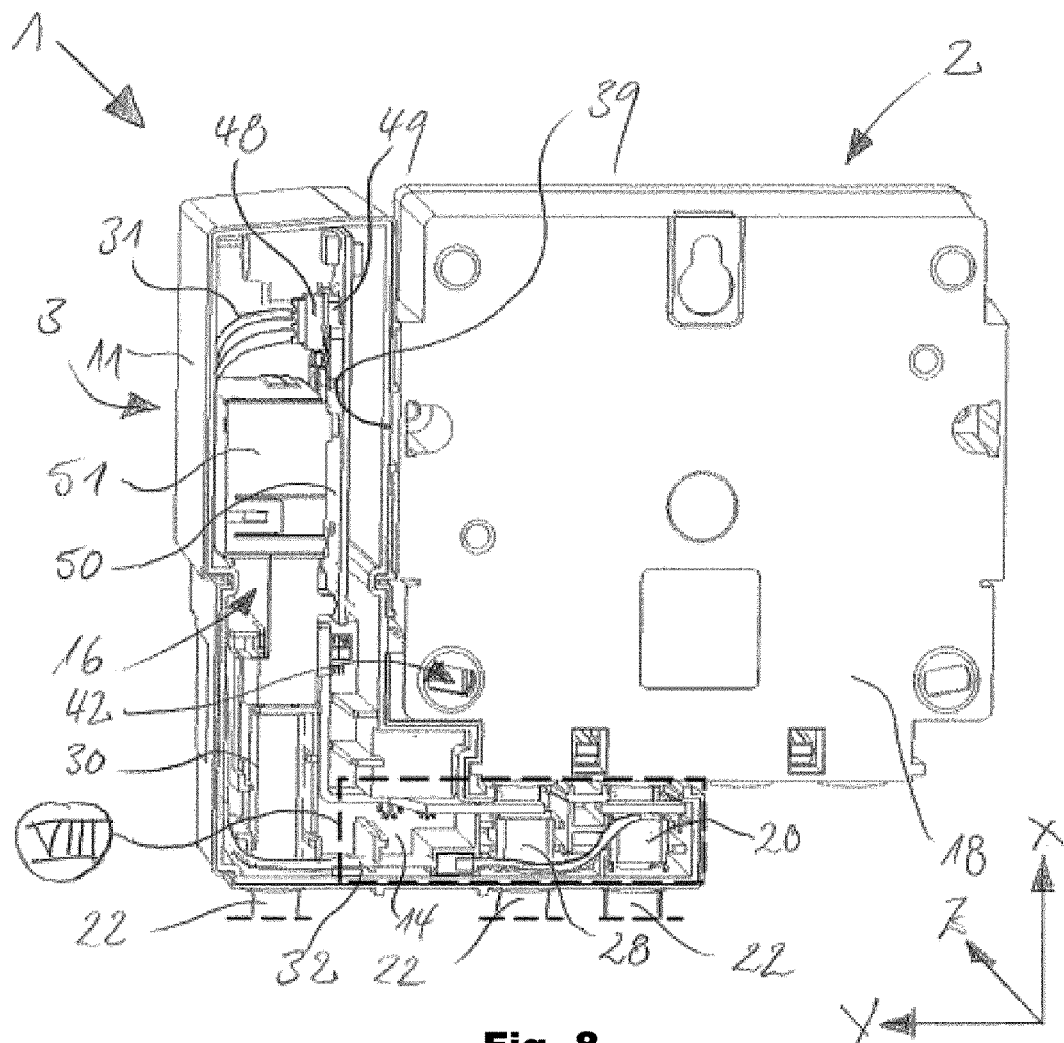
FIG. 8 shows a schematic perspective rear view of an embodiment of a meter arrangement according to the present invention in the pre-assembled state.

FIG. 8 shows a schematic perspective rear view of the meter arrangement 1 in the connected state C and in the pre-assembled state P. Here it becomes apparent that the supply lines 32 are connected to the module terminals 20 and from there extend through the module inner terminal cover 14 and then upwardly into the module main cover 12. Here, the supply lines 32 and the control lines 31 are joined in a joint connector 48 in the form of a plug which connects the supply lines 32 and the control lines 31 to a mating connector 19 in the form of a socket which is mounted on a substrate 50 in the form of a printed circuit board (PCB) of the load control unit 16. The substrate 50 further holds the switching device 51 of the load control unit 16. The switching device 51 may be embodied as a switch or relay, or alike, suitable for switching the electrical power between the module live input terminal 28 and the module live output terminal 30.

Figure 9:
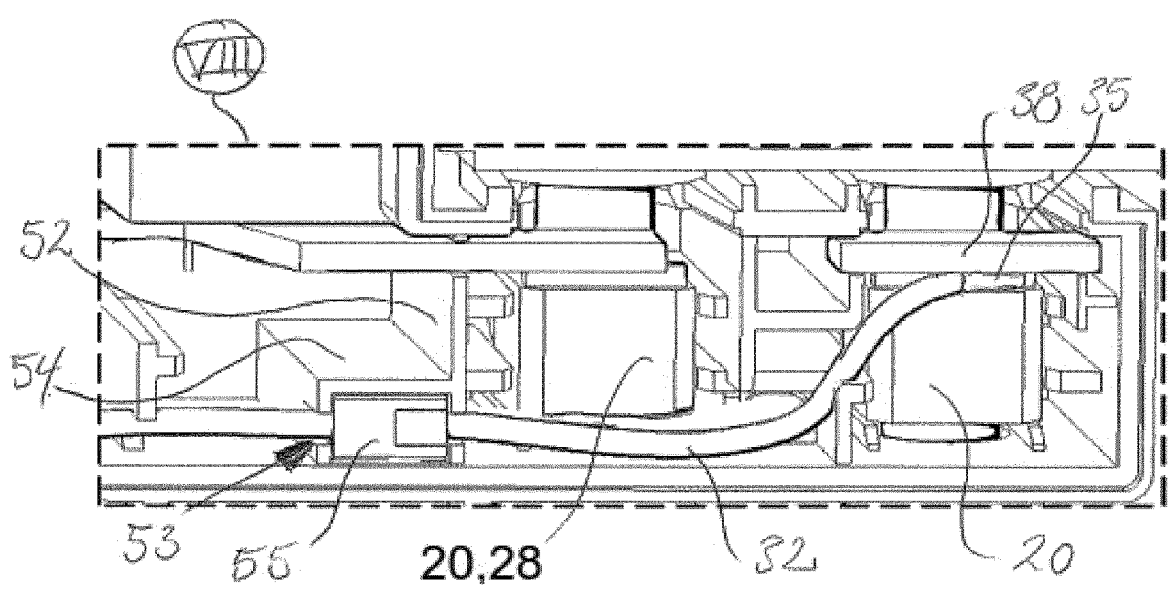
FIG. 9 shows a detail VIII of the meter arrangement shown in FIG. 8.

FIG. 9 shows a detail VIII of the meter arrangement 1 shown in FIG. 8. Here it becomes apparent that the bared end 35 of the supply line 32 is electrically connected to the module terminal 20. In particular, the bared end 35 is fixed to the module terminal 20 between the module terminal 20 and the conductor 38, for example by being soldered or braised to the model channel 20 and/or the conductor 38. The supply line 32 extends through a wall portion 52 of load control module 3. In the region of the wall portion 52 a passage 53 is formed for the supply line 32. A receptacle 54 provided at the wall portion 50 receives a cable guide 55 holding the supply line 32.

Figure 10:
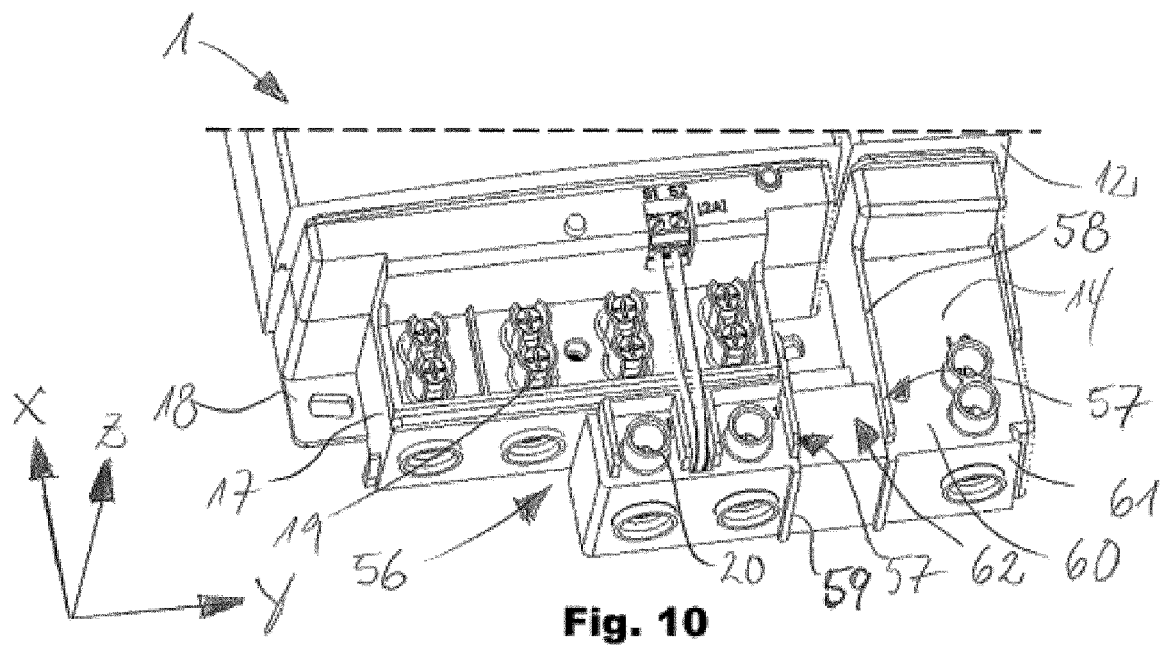
FIG. 10 shows a schematic perspective view of a combined terminal section of the meter arrangement.

FIG. 10 shows a schematic perspective view of a combined terminal section 56 of the meter arrangement 1. The combined terminal section 56 comprises the meter terminals 19 and the module terminals 20. In order to separate the module inner terminal cover 14 from the meter inner terminal cover 17, guide vanes 57 are formed on the outer surface of the module inner terminal cover 14. The guide vanes 57 comprise vertical sections 58 and lateral sections 59. The vertical sections 58 extend vertically from the module main cover 12 essentially in parallel to the longitudinal direction X downwardly along the module inner terminal cover 14 along a front side 60 towards a bottom side 61 thereof. The lateral sections 59 extend laterally from the front side 60 of the module inner terminal cover 14 where the vertical sections 58 are arranged, essentially in parallel to the height direction Z towards the rear of the load control module 3. Between the guide vanes 57, a liquid channel 62 is formed for channelling liquid away from the meter terminals 19.

Figure 11:
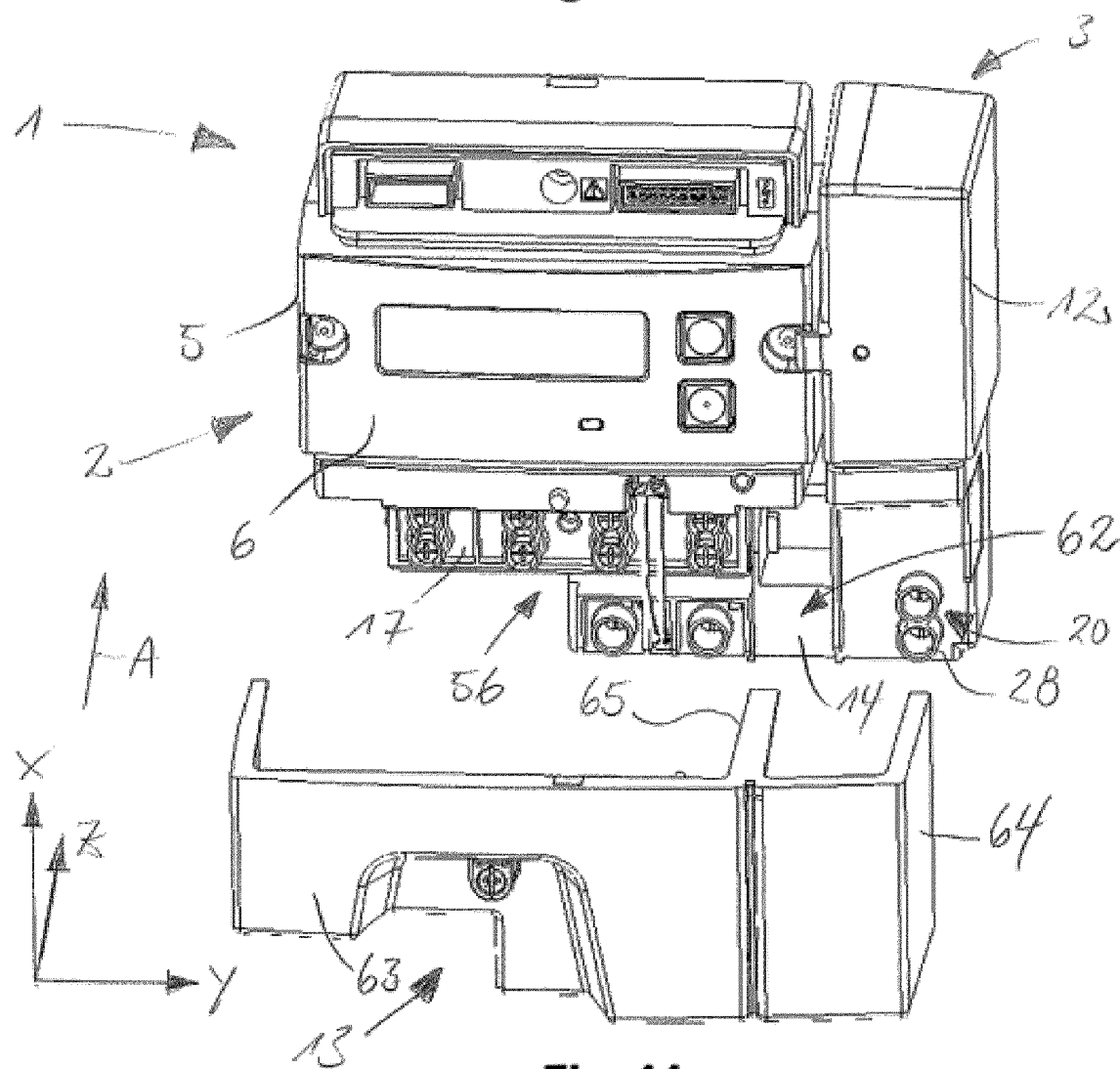
FIG. 11 shows a schematic perspective view of a meter arrangement and an outer terminal cover according to the present invention.

FIG. 11 shows a schematic perspective view of the meter arrangement 1 in the pre-assembled state P with the outer terminal cover 13 arranged in a position to be joined with the meter arrangement 1 by fitting the outer terminal cover 13 to the combined terminal section 56 through moving the outer terminal cover 13 towards the meter arrangement 1 in the assembly direction A. The outer terminal cover 13 comprises a meter cover portion 63 and a module cover portion 64. The meter cover portion 13 is configured to cover the combined terminal section 56 below the front panel 6 of the meter main cover 5. The module cover portion 64 is configured to cover the module terminal 20 below the module main cover 12, which module terminal serves 20 as the module live output terminal 28 being electrically separated from the combined terminal section 56 by means of the switching device 51 and separated from the combined terminal section 56 by means of the guide vanes 57. A parting member 65 is arranged between the meter cover portion 63 and the module, portion 64 and extends in a direction essentially in parallel with the assembly direction A.

Figure 12:
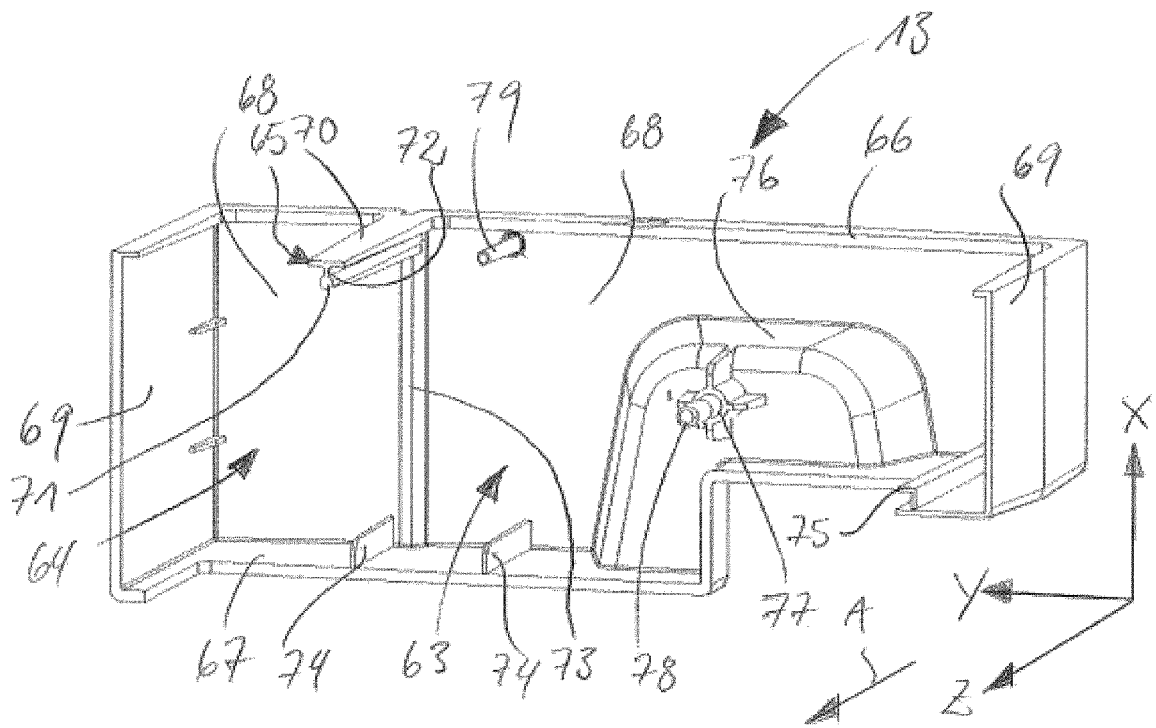
FIG. 12 shows another schematic perspective view of an embodiment of an outer terminal cover according to the present invention.

FIG. 12 shows another schematic perspective view of the outer terminal cover 13. The terminal cover 13 comprises an upper ledge 66, a lower ledge 67, front walls 68, and side walls 69. The parting member 65 has a flat top portion 70 and a guiding portion 71 which is connected to the flat top portion 70 via a bridge section 72. The parting member 65, in particular the flat top portion 70 thereof, is shaped such that it tapers along the assembly direction A. A support strut 73 extends from the parting member 65 downwardly along the front wall 68 essentially apparel with the longitudinal direction X towards the lower ledge 67. The support strut 73 helps in stabilising the outer terminal cover 13, in particular in the region of the parting member 65.

Furthermore, the outer terminal cover 13 comprises additional guide vanes 74, a holding profile 75, an indented fixation region 76 in the form of a bulge extending inwardly in the assembly direction A with respect to the front wall 68 and having a fixation opening 77 receiving a fixation element 78 in the form of a screw for fixing the outer terminal cover 13 to the meter arrangement 1, and an actuation member 79 the form of a pin extending inwardly from the front wall 68 for actuating an actuator of the utility meter 2 in order to signalise that the outer terminal cover 13 is properly mounted to the meter arrangement 1. The holding profile 75 has an L-shaped cross-section and is configured to engage the utility meter 2 in order to securely hold the outer terminal cover 13 at the utility meter 2 in a mounted position M (see FIGS. 13 to 16).

Figure 13:
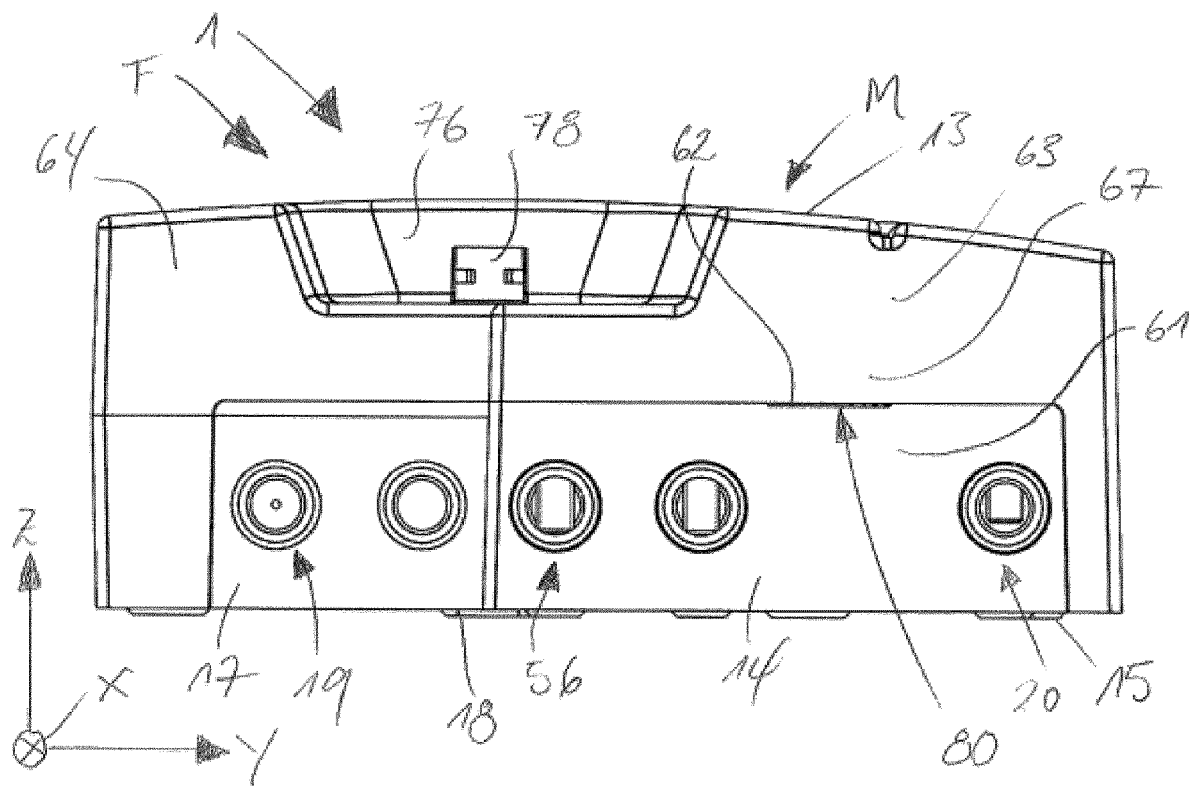
FIG. 13 shows a schematic bottom view of an embodiment of a meter arrangement according to the present invention in a fully assembled state.

FIG. 13 shows a schematic bottom view of an embodiment of a meter arrangement according to the present invention in a fully assembled state F with the outer terminal cover 13 and the mounted position M. Here it becomes apparent that when the outer terminal, 13 is joint with the module inner terminal cover 14 and the meter in a terminal cover 17, a liquid outlet 80 remains open in the region of the liquid channel 62. The liquid outlet 80 is formed as a cut out and a front edge of the bottom side 61 of the module inner terminal cover 14, such that the liquid outlet 80 is shaped as a narrow slot extending essentially in parallel to the transverse direction Y between the additional guide vanes 74.

Figure 14:
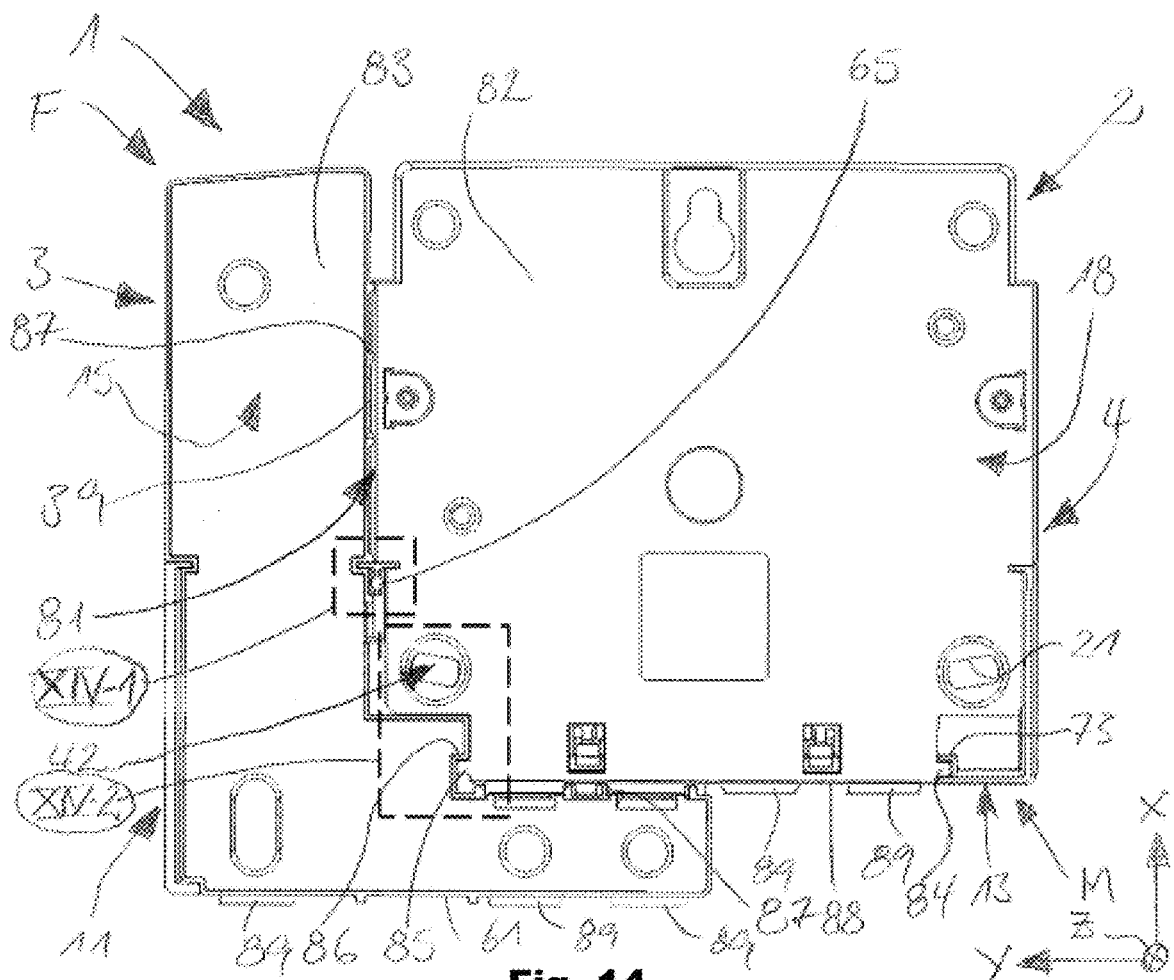
FIG. 14 shows a schematic rear view of an embodiment of a meter arrangement according to the present invention in the fully assembled state.

FIG. 14 shows a schematic rear view of an embodiment of the meter arrangement in the fully assembled state F. The load control module 3 is attached to the utility meter 2 with a gap 81 left therebetween. The meter base 18 provides a meter backside 82 which is aligned in a plane extending essentially in parallel with the longitudinal direction X and the transverse direction Y with a module backside 83 provided by the module base 15. The holding profile 73 of the outer terminal, 13 is an engagement with a holding element 84 formed as a rib extending essentially in parallel to the assembly direction A, such that it slides into the holding profile 73 when joining the outer terminal cover 13 with the meter arrangement 1. In the mounted state M of the outer terminal cover 13, the holding profile 73 is at least sectionwise supported by the holding element 84.

A further holding element 85 is formed at the side of the utility meter 2 opposing the side where the holding element 84 is provided. A step portion 86 formed at the module enclosure 11 is supported on the further holding element 85. In the region where the further holding member 85 engages the step portion 86, contours of the meter enclosure 4 and the module enclosure 11 complement each other such that a meandering shape is formed between the utility meter 2 and the load control module 3.

Furthermore, the module enclosure 11 is provided with rails protruding from the module enclosure 11 and extending essentially in parallel to the assembly direction A. The load control module 3 abuts the utility meter 2 with the rails 87 at the side face 39 and a lower side 88 of the meter enclosure 4, such that the gap 81 is created. Nozzles 89 are formed at the meter enclosure 4, and the module enclosure 11, such that they protrude downwardly from the lower side 88 of the meter in a terminal, 17 and the bottom side 61 of the module inner terminal cover 14 in order to guide the power cables 22 into the meter enclosure 4 and the module enclosure 11, respectively.

Figure 15:
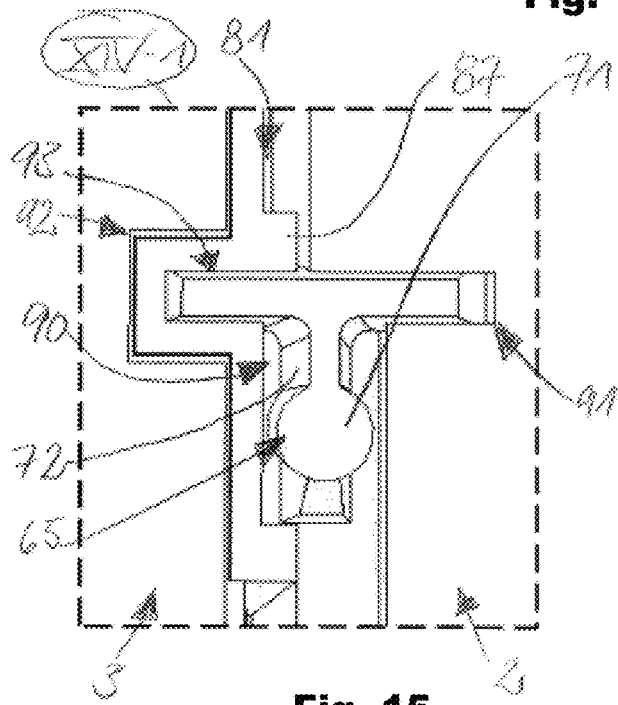
FIG. 15 shows a detail XIV-1 of the meter arrangement shown in FIG. 14.

FIG. 15 shows a detail XIV-1 of the meter arrangement shown in FIG. 14. Here it becomes apparent that in the region of the gap, a parting member guide profile 90 comprises a meter profile portion 91 and a module profile portion 92 formed at the meter enclosure for and the module enclosure 11, respectively, such that they complement each other for jointly receiving the parting member 65. Accordingly, by the complementing shapes of the parting member 65 and the parting member guide profile 90, a labyrinth 93 is created by the engaging outer contour is of the parting member 65 and the parting member guide profile 90.

Figure 16:
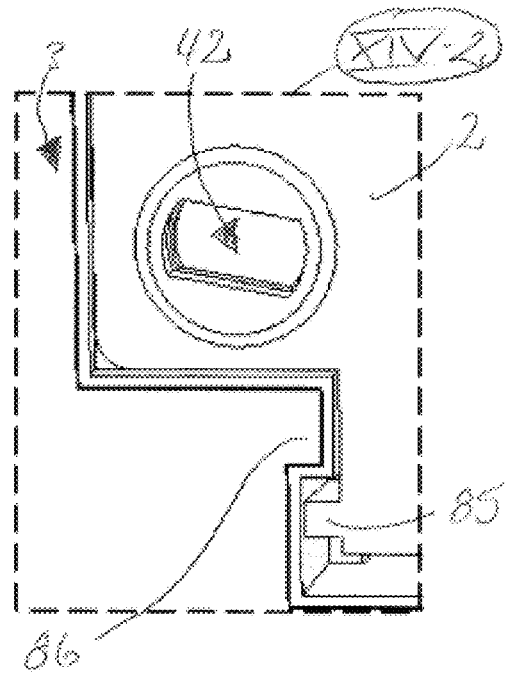
FIG. 16 shows a detail XIV-2 of the meter arrangement shown in FIG. 14.

FIG. 16 shows a detail XIV-2 of the meter arrangement shown in FIG. 14. Here it becomes apparent that the further holding element 85 and the step portion 86 with the complementary shapes are arranged in the vicinity of the common fixation location 42, such that when the meter arrangement 1 is fixed to a supporting structure (not shown) by means of a respective fixation element extending through the common fixation location 42, the utility meter 2 and the load control module 3 are jointly held.

Figure 17:
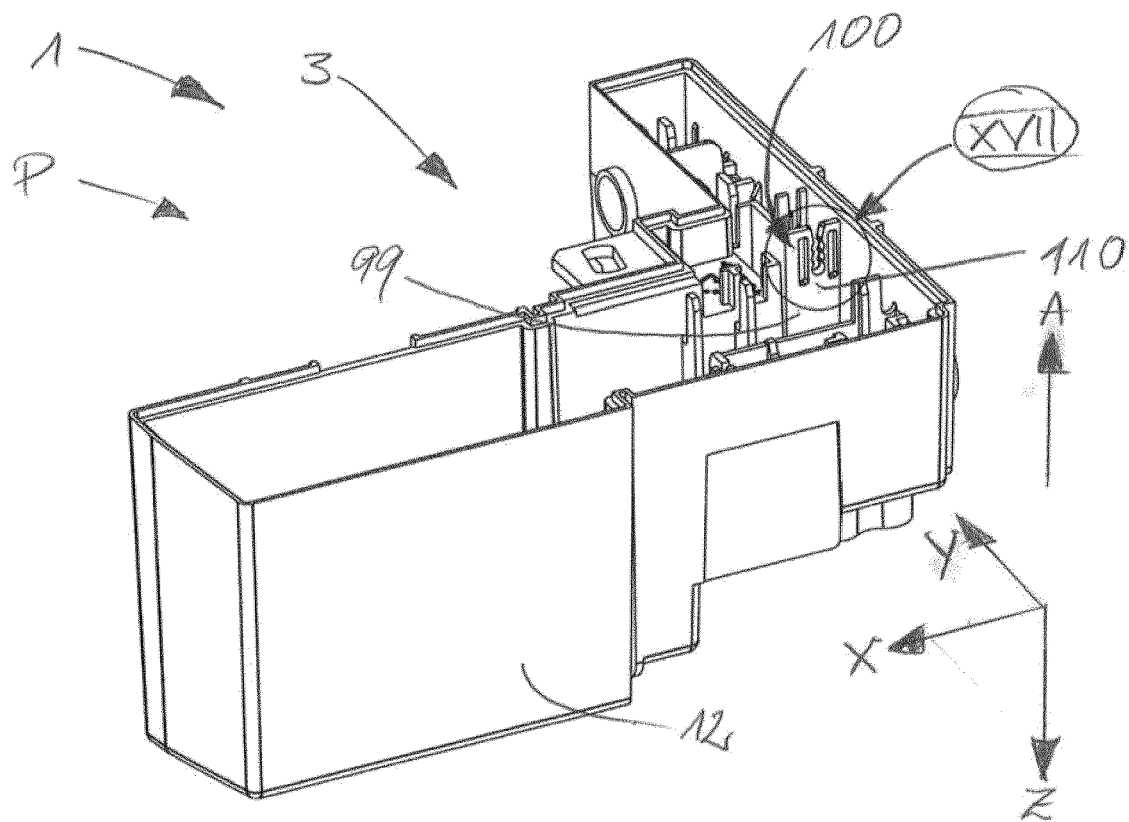
FIG. 17 shows a schematic perspective view of an electrical device, in particular of the outer terminal cover of the load control module of a meter arrangement provided with an ingress protection assembly according to the present invention.

FIG. 17 shows a schematic perspective view of an electrical device, in particular of the main cover 12 of the load control module 3 of the meter arrangement 1 having a partition wall 99 provided with an ingress protection assembly 100 according to the present invention. The ingress protection assembly 100 comprises a first wall section 110, as well as a second wall section 120 and a third wall section 130 (see FIGS. 19 and 20). The partition wall 99 provides a separation between the meter terminals 19 and the module terminal 20 so that the interior of the load control module 3 including the switching device 51 can be protected against ingress of insects, dust, liquids and other harmful substances which may travel along a wire 150 (see FIGS. 22 to 28) comprising the signal line 31 and/or the supply line 32.

Figure 18:
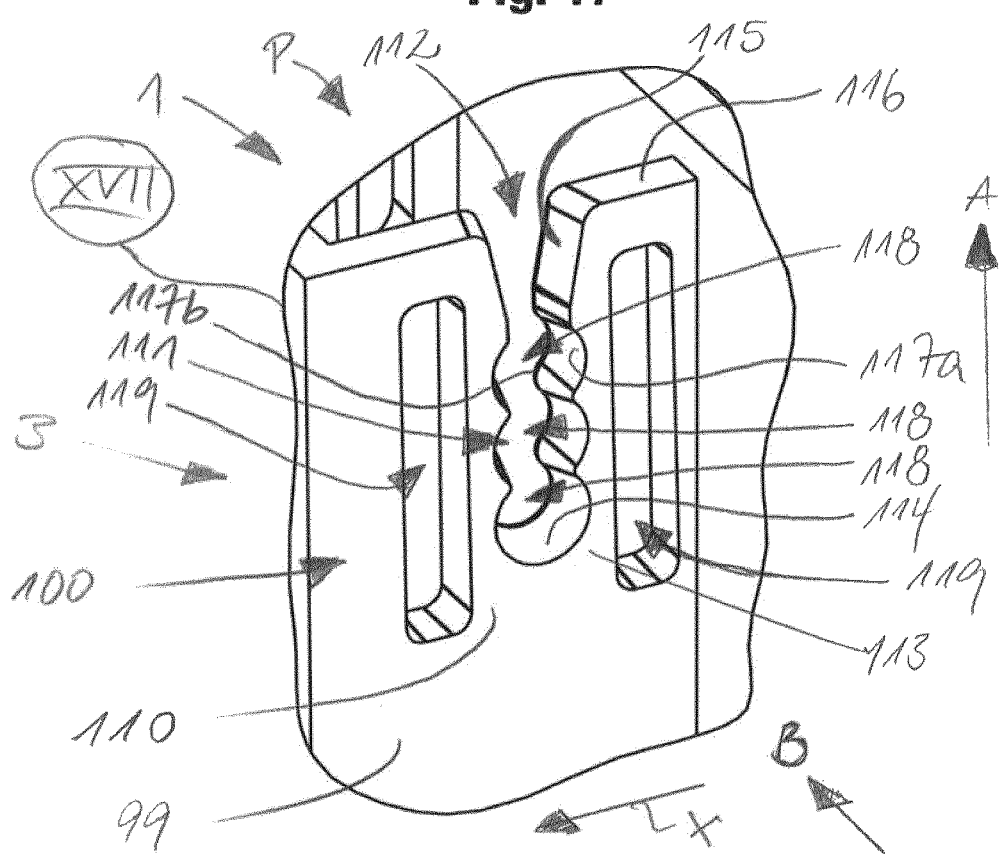
FIG. 18 shows a detail XVII of the ingress protection assembly shown in FIG. 17.

FIG. 18 shows a detail XVII of the ingress protection assembly 100 shown in FIG. 17. Here it becomes apparent that the first wall section 110 is provided with a receiving slot 111 extending through the first wall section 110 in a lead-through direction B running essentially in parallel to the transverse direction Y. The receiving slot 111 opens in the assembly direction A at an inlet 112 and is terminated in a direction opposite to the assembly direction A at a yoke section 113 providing a seating surface 114.

The inlet 112 is provided with the lead-in chamfer 115 extending between a horizontal top surface 116 of the first wall section 110 and an edge surface 117*a* of the first wall section 110. The edge surface 117*a* extends along the receiving slot 111 between the inlet 112 and the seating surface 114. The receiving slot 111 tapers along the lead-through direction B such that clamping edges 117*b* facing towards the receiving slot 111 are provided.

Furthermore, the receiving slot 111 widens in the longitudinal direction X in the region of a number of wire compartments 118 configured for accommodating the signal line 31, the supply line 32 and an auxiliary line 151, such as a ground connector of the wire 151 (see FIGS. 22 to 28). Cut-outs 119 of formed in the first wall section 110 such that they extend laterally along the receiving slot 111. The cut-outs 119 enhance a flexibility of the surfaces 117*a* and the clamping edges 117*b* in that their elastic displacement in and against the longitudinal direction X is facilitated.

Figure 19:
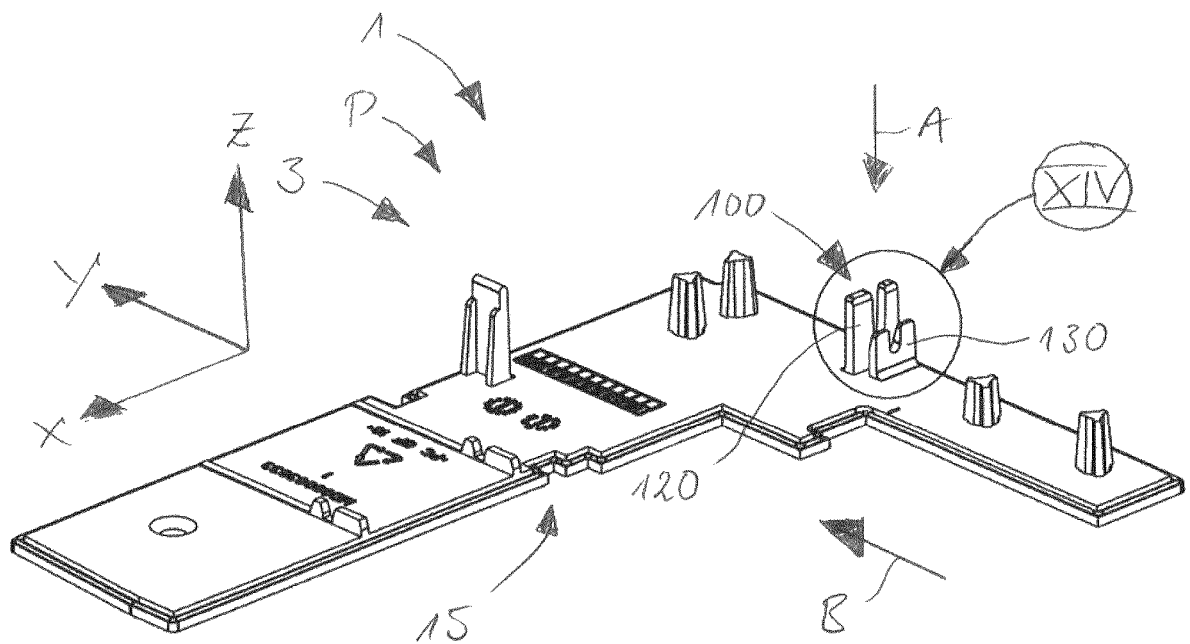
FIG. 19 shows a schematic perspective view of an electrical device, in particular of the module base of the load control module of a meter arrangement provided with an ingress protection assembly according to the present invention.

FIG. 19 shows a schematic perspective view of the electrical device, in particular of the module base 15 of the load control module 3 of the meter arrangement 1 provided with the ingress protection assembly 100. Here it becomes apparent that the ingress protection assembly 100 further comprises the second wall section 120 and a third wall section 130 which extend essentially in parallel to each other in the assembly direction A and are distanced from each other in the lead-through direction B such that the first wall section 110 can be inserted between the second wall section 120 in the third wall section 130.

Figure 20:
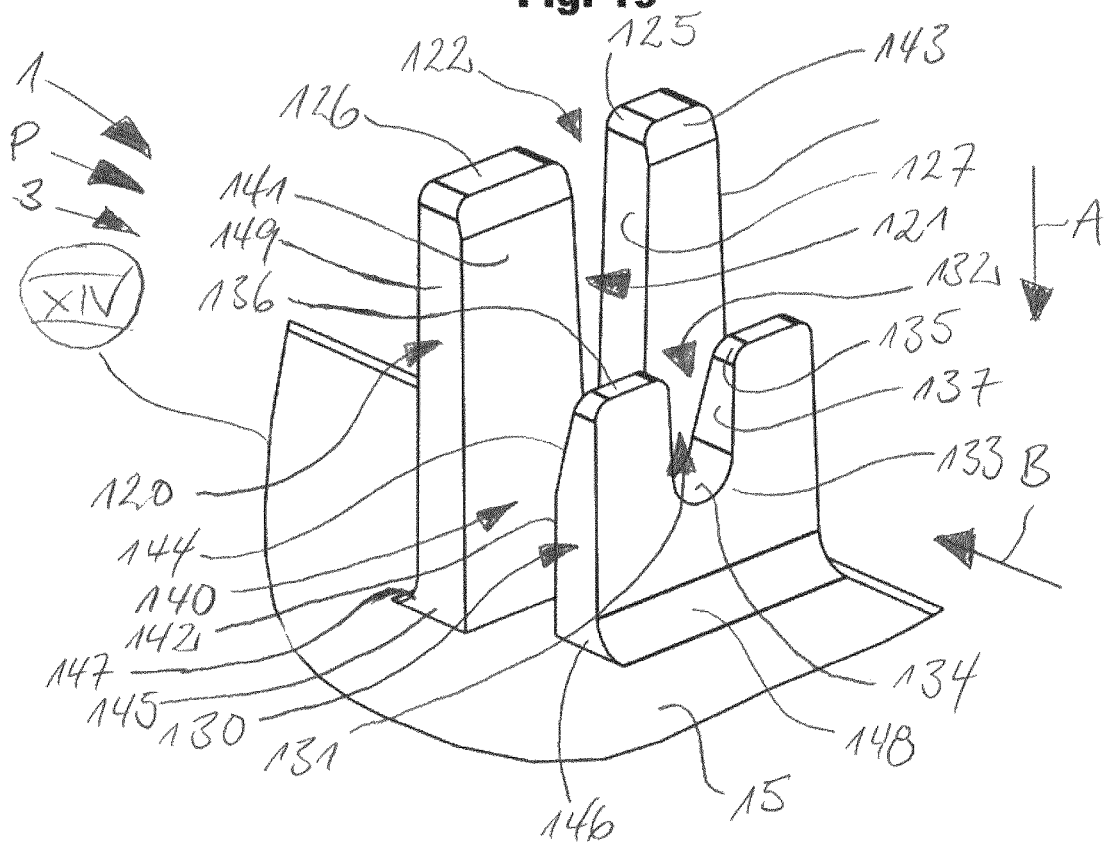
FIG. 20 shows a detail XIV of the ingress protection assembly shown in FIG. 17.

FIG. 20 shows a detail XIV of the ingress protection assembly shown in FIG. 17. Here it becomes apparent that analogously to the first wall section 110, the second wall section 120 and the third wall section 130 each comprise a counter slot 121, 131, opening in a direction opposite to the assembly direction A at a counter inlet 122, 132, and being terminated in the assembly direction A and a yoke section 123, 133, where respective seating surfaces 124, 134 (see also FIG. 26) are provided facing against the assembly direction A. Lead-in chamfers 125, 135 are formed between top surfaces 126, 136 and edge surfaces 127, 137 of each of the first wall section 120 and the second wall section 130, respectively.

An intermediate space 140 is provided in the form of a gap between the second wall section 120 and the third wall section 130. Guide surfaces 141, 142 of the second wall section 120 and the third wall section 130, respectively, are facing towards the intermediate space 140. Between the guide surfaces 141, 142 and the top surfaces 136, 136 of each of the second wall section 120 and the third wall section 130, bevels 143, 144 are formed for facilitating an introduction of the first wall section 110 in the assembly direction A into the intermediate space 140.

Furthermore, the counter slots 122, 132 provided in the second wall section 120 and the third wall section 130 slightly narrow in that they taper along the assembly direction A between the respective lead-in chamfers 125, 135 and the yoke sections 123, 133. The second wall section 120 and the third wall section 130 are connected to a walling of the electrical device, here the module base 15, via respective root areas 145, 146. At the root areas 145, 146, the second wall portion 120 and the third wall portion 130 are each provided with curvature 147, 148 facing away from the intermediate space 140 and increasing a stiffness of the second wall section 120 and the third wall section 130 at their respective root areas 145, 146. From the root areas 145, 146, the second wall section 120 in the third wall section 130 extend upwardly in the form of legs 149 via the respective yoke sections 123, 133.

FIG. 21 shows a schematic perspective view of the electrical device, in particular the load control module 3 of the meter arrangement 1, with the ingress protection assembly 100 in the fully assembled state F and the wire 150 in the connected state C. The module main cover 12 is joined with the module base 15 by moving the module main cover 12 and the module base 15 towards each other in the assembly direction A until they have reached the fully assembled state F.

FIG. 22 shows a detail of the ingress protection assembly 100 according to the present invention together with the wire 150 in the pre-assembled state P. The wire 150 is positioned above the first wall section 110 in the assembly direction A such that it may be inserted into the receiving slot 111 through the inlet 112 thereof. The module base 15 with the second wall section 120 and the third wall section 130 is positioned above the wire 150 and the module main cover 12 with the first wall section 110 in the assembly direction A such that the first wall section 110 may be brought into engagement with the second wall section 120 and the third wall section 130 by moving the module main cover 12 towards the module base 15 along the assembly direction A.

FIG. 23 shows a detail of the ingress protection assembly 100 according to the present invention in the pre-assembled state P together with the wire 150 in the connected state C. The wire 150 is inserted into the receiving slot 111 of the first wall section 110 by moving the wire 150 against the assembly direction A through the inlet 112 into the receiving slot 1 and 11. Each of the lines of the wire, i.e. the signal line 31, the supply line 32, and the auxiliary line 150 is accommodate within one of the wire compartments 118 of the receiving slot 111. The module base 15 with the second wall section 120 and the third wall section 130 can now be joined with the module main cover 12 for transferring the ingress protection assembly 100 from the pre-assembled state P into the fully assembled state F.

FIG. 24 shows a detail of the ingress protection assembly 100 according to the present invention in the fully assembled state F together with the wire 150 in the connected state C. The module main cover 12 is joined with the module base 15. The wire 150 is firmly held between the first wall section 110 on the one side and the second wall section 120 as well as the third wall section 130 on the other side. The first wall section 110 is received between the second wall section 120 and a third wall section 130.

Figure 25:
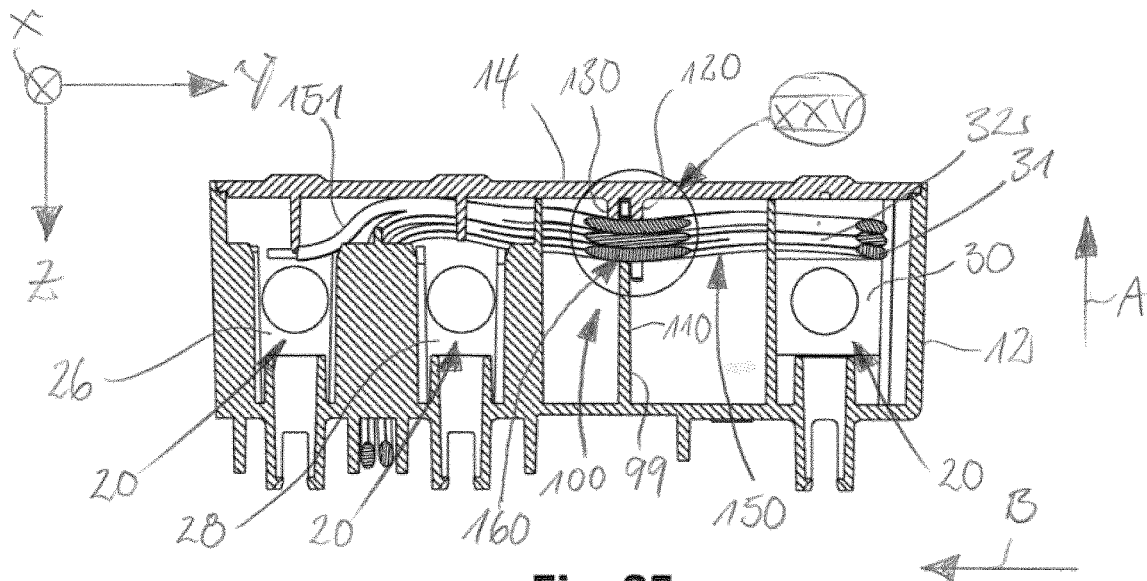
FIG. 25 shows a schematic perspective cross-sectional view of the load control module along a cross-sectional plane extending along a longitudinal axis of a wire in the connected state received in the ingress protection assembly according to the present invention and the fully assembled state as shown in FIG. 24.

FIG. 25 shows a schematic perspective cross-sectional view of the load control module 3 along a cross-sectional plane extending along a longitudinal axis of a wire 150 in the connected state C received in the ingress protection assembly 100 according to the present invention 100 in the fully assembled state as shown in FIG. 24. The wire 150 is led through the partition wall 99 at an aperture 160 provided by the ingress protection assembly 100. Thereby, any ingress of insects, dust and/or liquids along the wire 150 through the partition wall 99 is prevented.

Figure 26:
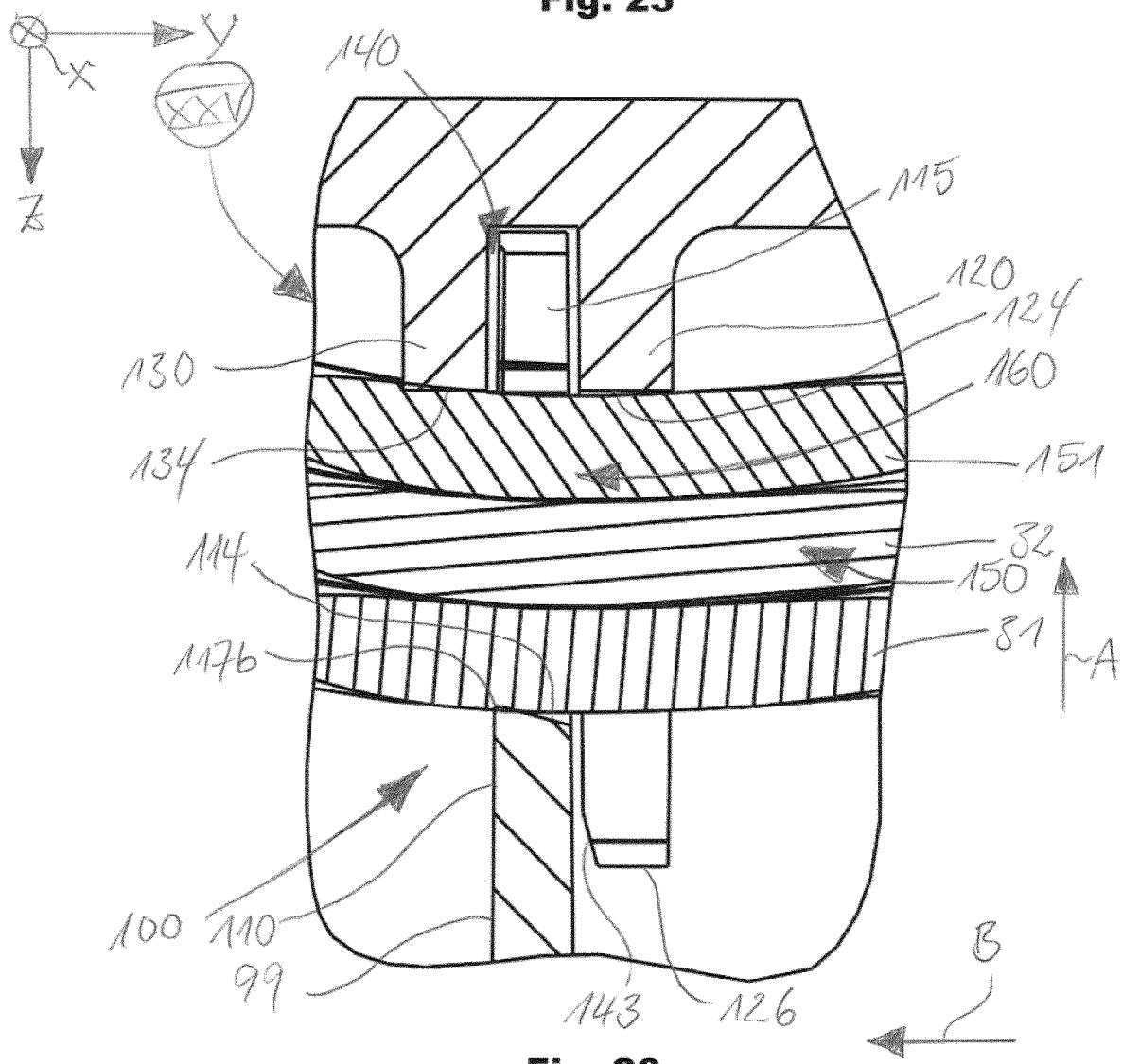
FIG. 26 shows a detail XXV of the ingress protection assembly shown in FIG. 25.

FIG. 26 shows a detail XXV of the ingress protection assembly shown in FIG. 25. Here it becomes apparent that the wire 150 is compressed in the aperture 160 between the support surface 114 of the first wall section 110 on the one side and the support surfaces 124, 134 of the second wall section 120 and the third wall section 130, respectively, on the other side of the aperture 160. The clamping edge 117b partly protrudes into the wire 150 along its outer circumference. The first wall section 110 is received and the intermediate space 140 between the second wall section 120 the third wall section 130.

Figure 27:
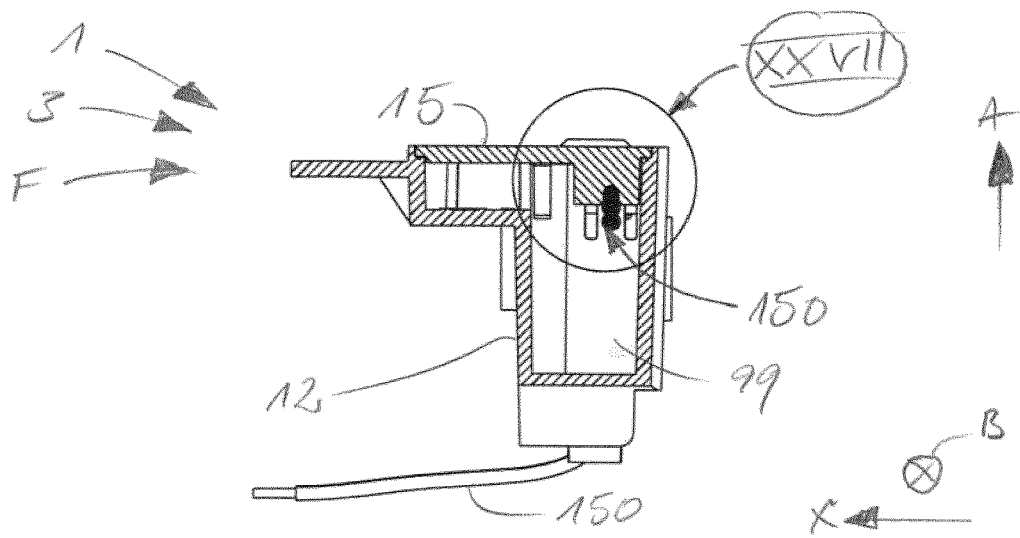
FIG. 27 shows a schematic perspective cross-sectional view of the load control module along a cross-sectional plane extending essentially in parallel to the assembly direction and the longitudinal direction through a wall section of the ingress protection assembly according to the present invention in the fully assembled state and a wire in the connected state received in the ingress protection assembly as shown in FIGS. 24 to 26.

FIG. 27 shows a schematic perspective cross-sectional view of the load control module 3 along a cross-sectional plane extending essentially in parallel to the assembly direction A and the longitudinal direction X through the third wall section 130 of the ingress protection assembly 100 according to the present invention in the fully assembled state F while the wire 150 in the connected state C is received in the ingress protection assembly 100 as shown in FIGS. 24 to 26.

Figure 28:
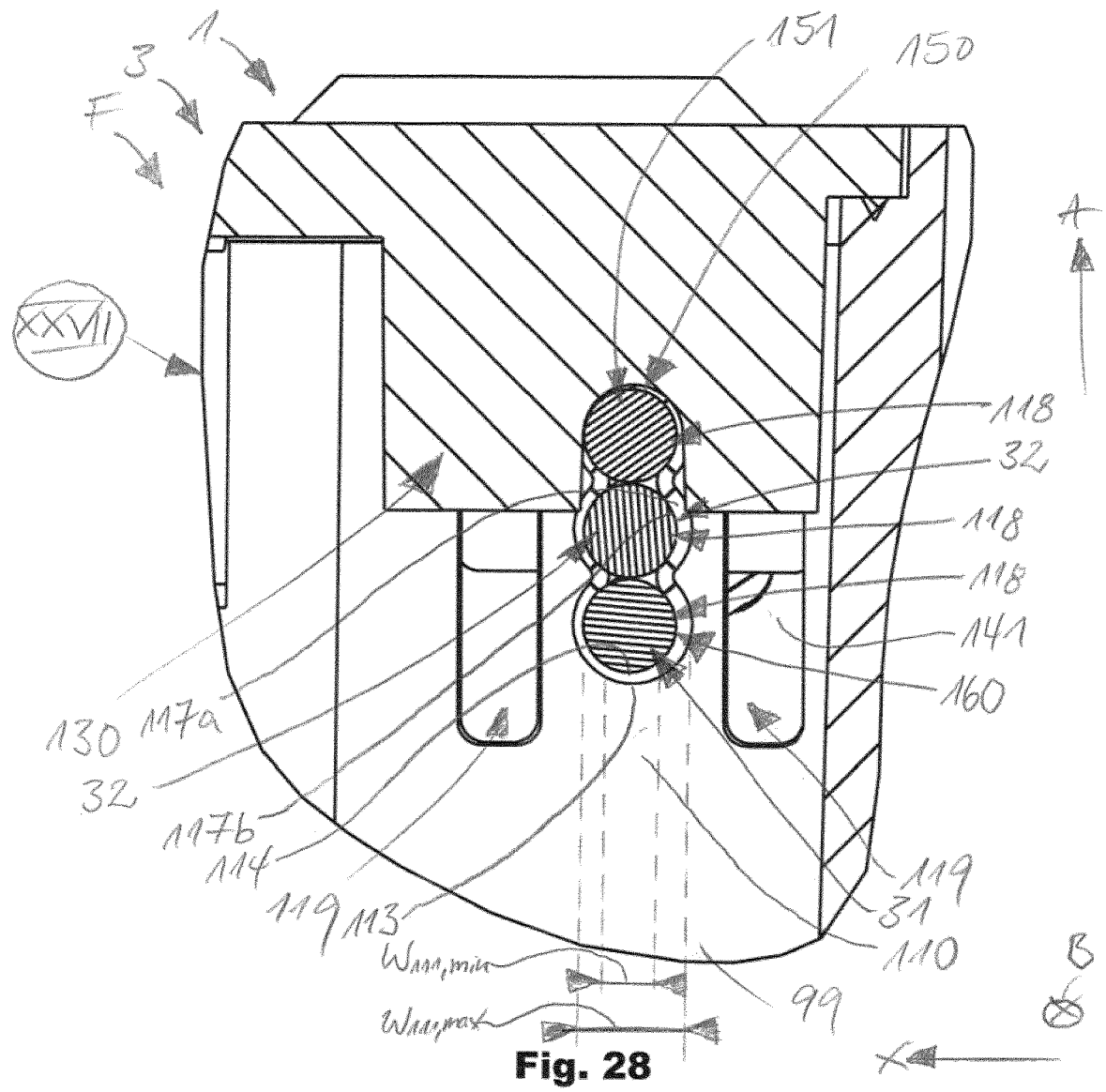
FIG. 28 shows a detail XXVII of the ingress protection assembly shown in FIG. 27.

FIG. 28 shows a detail XXVII of the ingress protection assembly 100 shown in FIG. 27. Here it becomes apparent that measured in parallel to the longitudinal direction X, the receiving slot 111 has a maximum width $w_{111,\ max}$ and a minimum width $w_{111,\ min}$. Through having alternating sections of maximum width $w_{111,\ max}$ and minimum width $w_{111,\ min}$, the wire compartments 118 are formed above each other in the assembly direction A along the receiving slot 111 for tightly encompassing each single one of the signal line 31, the supply line 32, and the auxiliary line 151 of the wire 150. The cut-outs 119 in the first wall section 110 are closed up by the second wall section 120, in particular the guide surface 141 thereof. Thus, the wire 150 is held circumferentially tightly encompassed in the aperture 160 with the first wall section 110, the second wall section 120, and the third wall section 130 being superimposed along the lead-through direction B such that the partition wall 99 is closed up by the wire 150 in the region of the aperture 160 and the cut-outs 119 a closed up with the help of the second wall section 120.

Deviations from the above-described embodiments are possible without departing from the scope of the present invention.

The meter arrangement 1 may comprise utility meters 2 and/or load control modules 3 which individually and/or in any kind of combination witch each other may constitute electrical devices including meter enclosures 4, meter main covers 5, front panels 6, displays 7, controls 8, connector sections 9, connectors/sockets 10, module enclosures 11, module main covers 12, outer terminal covers 13, module inner terminal covers 14, module bases 15, load control units 16, meter inner terminal covers 17, meter bases 18, meter terminals 19, module terminals 20, fixation means 21, power cables 22, neutral output lines 23, first live output lines 24, second live output lines 25, module neutral output terminals 26, metering neutral output terminals 27, module live input terminals 28, meter live output terminals 29, module live output terminals 30, signal lines 31, supply lines 32, blind holes 33, through-holes 34, bared ends 35, insulations 36, fixation elements 37 conductors 38, side faces 39, counter latching elements 40, latching elements 41, common fixing locations 42, auxiliary control terminals 43, control line passages 44, first gauges 46, second gauges 47, connectors 48, mating connectors 49, substrates 50, switching devices 51, wall portions 52, passages 53 receptacles 54, cable guides 55, combined terminal sections 56, guide vanes 57, vertical sections 58, lateral sections 59, front sides 60, bottom sides 61, liquid channels 62, meter cover portions 63, module cover portions 64, parting members 65, upper ledges 66, lower ledges 67, front walls 68, side walls 69, flat top portions 70, guiding portions 71, bridge sections 72, support struts 73, additional guide vanes 74, holding profiles 75, fixation regions 76, fixation openings 77, fixation elements 78, actuation members 79, liquid outlets 80, gaps 81, meter backsides 82, module backsides 83, holding elements 84, further holding elements 85, step portions 86, rails 87, lower sides 88, collars 89, parting member guide profiles 90, meter profile portions 91, module profile portions 92, labyrinths 93, and/or partition walls 99, with ingress protection assemblies 100, first wall sections 110, receiving slots 111, inlets 112, yoke sections 113, seating surfaces 114, lead-in chamfers 115, top surfaces 116, edge surfaces 117a, clamping edges 117b, wire compartments 118, cut-outs 119 second wall sections 120, counter slots 121, inlets 122, yoke sections 123, seating surfaces 124, lead-in chamfers 125, top surfaces 126, edge surfaces 127, third wall sections 130, counter slots 131, inlets 132, yoke sections 133, seating surfaces 134, lead-in chamfers 135, top surfaces 136, edge surfaces 137, intermediate spaces 140, guide surfaces 141, 142, bevels 143, 144, root areas 145, 146, curvatures 147, 148, legs 149, cables 150, auxiliary lines 151, and/or apertures 160, with respective first strip off lengths l1, second strip off lengths l2, minimum widths $w_{111,\ min}$, and/or maximum widths $w_{111,\ max}$, assembly directions A lead-through directions B, connected states C, fully assembled states F, longitudinal axes L, mounted positions M, pre-assembled states P, longitudinal directions X, transverse directions Y, and/or height directions Z in any number, form, arrangement, location and/or relation required for achieving the desired respective technical effect.

REFERENCE SIGNS

| | |
|---|---|
| 1 | meter arrangement |
| 2 | utility meter |
| 3 | load control module |
| 4 | meter enclosure |
| 5 | meter main cover |
| 6 | front panel |
| 7 | display |
| 8 | controls |
| 9 | connector section |
| 10 | connector/socket |
| 11 | module enclosure |
| 12 | module main cover |
| 13 | outer terminal cover |
| 14 | module inner terminal cover |
| 15 | module base |
| 16 | load control unit |
| 17 | meter inner terminal cover |
| 18 | meter base |
| 19 | meter terminal |
| 20 | module terminal |
| 21 | fixation means |
| 22 | power cable |
| 23 | neutral output line |
| 24 | first live output line |
| 25 | second live output line |
| 26 | module neutral output terminal |
| 27 | metering neutral output terminal |
| 28 | module live input terminal |
| 29 | meter live output terminal |
| 30 | module live output terminal |
| 31 | signal line |
| 32 | supply line |
| 33 | blind hole |
| 34 | through-hole |
| 35 | bared end |
| 36 | insulation |
| 37 | fixation element |
| 38 | conductor |
| 39 | side face |
| 40 | counter latching element |
| 41 | latching element |
| 42 | common fixing location |
| 43 | auxiliary control terminal |
| 44 | control line passage |
| 46 | first gauge |
| 47 | second gauge |
| 48 | connector |
| 49 | mating connector |
| 50 | substrate |
| 51 | switching device |
| 52 | wall portion |
| 53 | passage |
| 54 | receptacle |
| 55 | cable guide |
| 56 | combined terminal section |
| 57 | guide vane |
| 58 | vertical section |
| 59 | lateral section |
| 60 | front side |
| 61 | bottom side |
| 62 | liquid channel |
| 63 | meter cover portion |
| 64 | module cover portion |
| 65 | parting member |
| 66 | upper ledge |
| 67 | lower ledge |
| 68 | front wall |
| 69 | side wall |
| 70 | flat top portion |
| 71 | guiding portion |
| 72 | bridge section |
| 73 | support strut |
| 74 | additional guide vane |
| 75 | holding profile |
| 76 | fixation region |
| 77 | fixation opening |
| 78 | fixation element |
| 79 | actuation member |
| 80 | liquid outlet |
| 81 | gap |
| 82 | meter backside |
| 83 | module backside |
| 84 | holding element |
| 85 | further holding element |
| 86 | step portion |
| 87 | rail |
| 88 | lower side |
| 89 | collar |
| 90 | parting member guide profile |
| 91 | meter profile portion |
| 92 | module profile portion |
| 93 | labyrinth |
| 99 | partition wall |
| 100 | ingress protection assembly |
| 110 | first wall section |
| 111 | receiving slot |
| 112 | inlet |
| 113 | yoke section |
| 114 | seating surface |
| 115 | lead-in chamfer |
| 116 | top surface |
| 117a | edge surface |
| 117b | clamping edge |
| 118 | wire compartment |
| 119 | cut-out |
| 120 | second wall section |

-continued

| | |
|---|---|
| 121 | counter slot |
| 122 | inlet |
| 123 | yoke section |
| 124 | seating surface |
| 125 | lead-in chamfer |
| 126 | top surface |
| 127 | edge surface |
| 130 | third wall section |
| 131 | counter slot |
| 132 | inlet |
| 133 | yoke section |
| 134 | seating surface |
| 135 | lead-in chamfer |
| 136 | top surface |
| 137 | edge surface |
| 140 | intermediate space |
| 141, 142 | guide surface |
| 143, 144 | bevel |
| 145, 146 | root area |
| 147, 148 | curvature |
| 149 | leg |
| 150 | cable |
| 151 | auxiliary line |
| 160 | aperture |
| I1 | first strip off length |
| I2 | second strip off length |
| $W_{111, min}$ | minimum width |
| $W_{111, max}$ | maximum width |
| A | assembly direction |
| B | lead-through direction |
| C | connected state |
| F | fully assembled state |
| L | longitudinal axis |
| M | mounted position |
| P | pre-assembled state |
| X | longitudinal direction |
| Y | transverse direction |
| Z | height direction |

The invention claimed is:

1. An ingress protection assembly for leading a wire in a sealed-up manner through a partition wall of an electrical device, the ingress protection assembly comprising
a first wall section provided with a receiving slot extending through the first wall section in a lead-through direction and opening at an inlet facing in an assembly direction of the ingress protection assembly; and
a second wall section provided with a counter slot extending through the second wall section in the lead-through direction and opening at a counter inlet facing against the assembly direction, wherein the second wall section has a root area provided with a curvature at least partially facing away from the first wall section, wherein
at least in a fully assembled state of the ingress protection assembly, the first wall section and the second wall section are at least partially superimposed in a projection along the lead-through direction such that the receiving slot and the counter slot together form an aperture configured for tightly encompassing the wire.

2. The ingress protection assembly according to claim 1, wherein at least in the fully assembled state, the first wall section and the second wall section abut each other in the lead-through direction.

3. The ingress protection assembly according to claim 1, wherein at least one of the receiving slot, and the counter slot is terminated by a yoke section providing a seating surface facing towards the inlet or the counter inlet, respectively.

4. The ingress protection assembly according to claim 1, wherein at least one of the receiving slot, and the counter slot at least section-wise tapers along the lead-through direction.

5. The ingress protection assembly according to claim 1, wherein at least one of the inlet and the counter inlet is provided with a lead-in chamfer.

6. The ingress protection assembly according to claim 1, wherein at least one of the receiving slot and the counter receiving slot partially widen in a longitudinal direction of the ingress protection assembly extending essentially perpendicularly to the assembly direction and the lead-through direction, to form a wire compartment configured for tightly encompassing an outer circumference of the wire.

7. The ingress protection assembly according to claim 6, wherein at least two wire compartments are arranged next each other along the assembly direction.

8. The ingress protection assembly according to claim 1, wherein next to at least one of the receiving slot and the counter slot, a cut-out is formed in the first wall section or the second wall section, respectively.

9. The ingress protection assembly according to claim 1, wherein at least in the fully assembled state, at least one cut-out formed in the first wall section or the second wall section is covered by a respective opposing first wall section or second wall section.

10. The ingress protection assembly according to claim 1, wherein a third wall section provided with an additional counter slot extending through the third wall section in the lead-through direction and having an additional counter inlet facing against the assembly direction, wherein
at least in the fully assembled state, the first wall section is arranged between the second wall section and the third wall section such that they are at least partially superimposed in a projection along the lead-through direction and the receiving slot, the counter receiving slot, and the counter receiving slot together form the aperture.

11. The ingress protection assembly according to claim 10, wherein a height of the third wall section is smaller than the height of the second wall section-measured in parallel to the assembly direction.

12. The ingress protection assembly according to claim 10, wherein a bevel formed at a vertical edge of at least one of the first wall section and the second wall section and at least partially facing towards the first wall section.

13. The ingress protection assembly according to claim 10, wherein the third wall section has a second root area provided with a curvature at least partially facing away from the first wall section.

14. The ingress protection assembly according to claim 1, wherein the first wall section is part of the partition wall.

15. An electrical device, in particular meter arrangement, comprising an ingress protection assembly according to claim 1.

16. The ingress protection assembly according to claim 1, wherein the wire is a signal line or a supply line.

* * * * *